United States Patent
Tahara et al.

(10) Patent No.: US 7,964,511 B2
(45) Date of Patent: Jun. 21, 2011

(54) PLASMA ASHING METHOD

(75) Inventors: Shigeru Tahara, Nirasaki (JP);
Naotsugu Hoshi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 263 days.

(21) Appl. No.: 11/509,591

(22) Filed: Aug. 25, 2006

(65) Prior Publication Data

US 2007/0059933 A1    Mar. 15, 2007

Related U.S. Application Data

(60) Provisional application No. 60/722,966, filed on Oct. 4, 2005.

(30) Foreign Application Priority Data

Sep. 9, 2005  (JP) ................................. 2005-262713

(51) Int. Cl.
  *H01L 21/302*  (2006.01)
  *H01L 21/461*  (2006.01)
(52) U.S. Cl. ............. 438/710; 438/712; 216/67; 216/71
(58) Field of Classification Search .................. 438/710, 438/712; 216/67, 71
  See application file for complete search history.

(56) References Cited

U.S. PATENT DOCUMENTS

| 6,057,247 | A * | 5/2000 | Imai et al. ...................... 438/714 |
| 6,607,986 | B2 | 8/2003 | Seta et al. |
| 2002/0081855 | A1 * | 6/2002 | Jiang et al. .................... 438/694 |
| 2003/0040192 | A1 | 2/2003 | Kanegae |
| 2003/0192856 | A1 * | 10/2003 | Balasubramaniam et al. . 216/56 |
| 2005/0103441 | A1 | 5/2005 | Honda et al. |
| 2005/0106875 | A1 * | 5/2005 | Kubota et al. ................. 438/689 |

FOREIGN PATENT DOCUMENTS

| CN | 1647257 | 7/2005 |
| JP | 11-145111 | 5/1999 |
| JP | 2000-195830 | 7/2000 |
| JP | 2001-189302 | 7/2001 |
| JP | 2003-059911 | 2/2003 |
| JP | 2004-119539 | 4/2004 |
| JP | 2005-101289 | 4/2005 |

* cited by examiner

*Primary Examiner* — Alexander G Ghyka
*Assistant Examiner* — Leonard Chang
(74) *Attorney, Agent, or Firm* — Oblon, Spivak, McClelland, Maier & Neustadt, L.L.P.

(57) ABSTRACT

A plasma ashing method is used for removing a patterned resist film in a processing chamber after etching a portion of a low-k film from an object to be processed in the processing chamber by using the patterned resist film as a mask. The method includes a first step of supplying a reaction product removal gas including at least $CO_2$ gas into the processing chamber, generating plasma of the reaction product removal gas by applying a high frequency power for the plasma generation, and removing reaction products deposited on an inner wall of the processing chamber; and a second step of supplying an ashing gas into the processing chamber, generating plasma of the ashing gas by applying a high frequency power for the plasma generation, and removing the resist film.

14 Claims, 11 Drawing Sheets

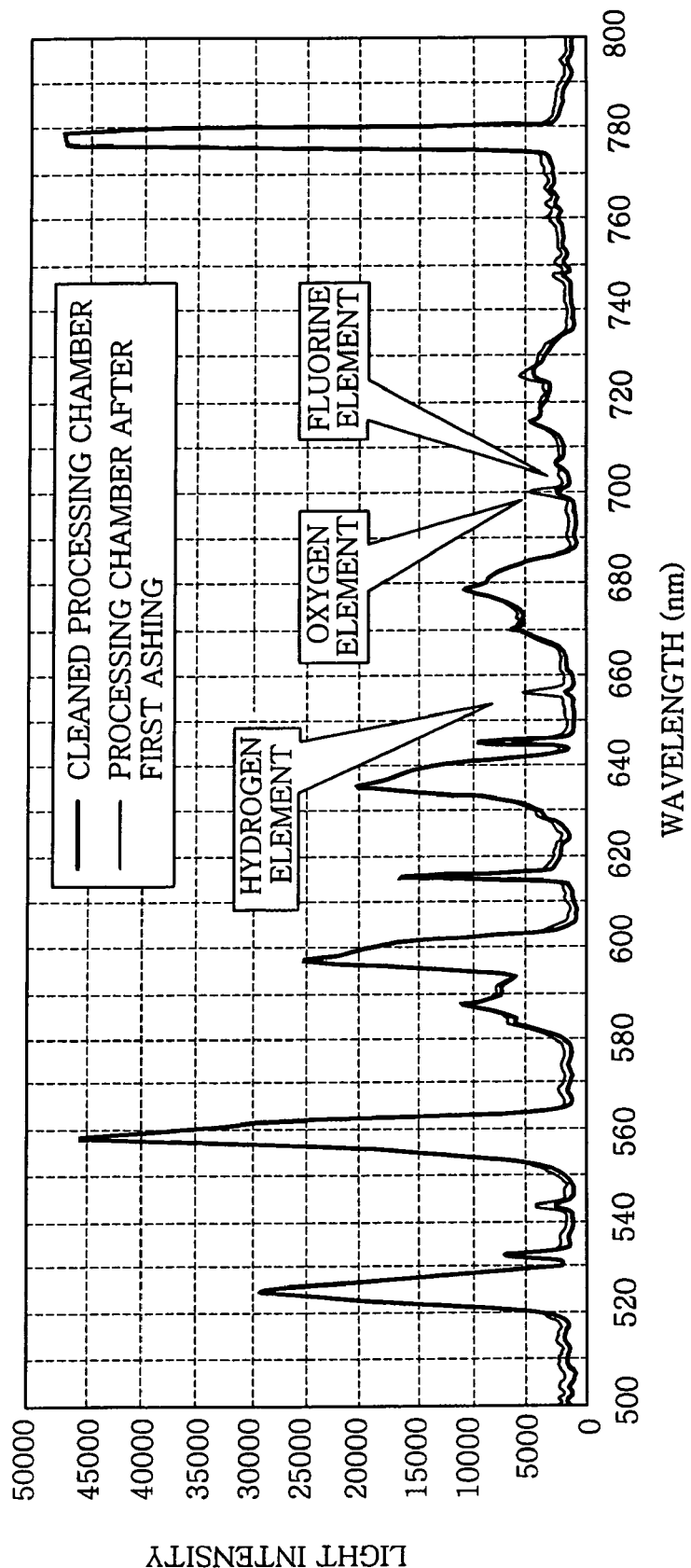

PLASMA ASHING METHOD

CROSS-REFERENCE TO RELATED APPLICATIONS

This document claims priority to Japanese Patent Application No. 2005-262713, filed on Sep. 9, 2005 and U.S. Provisional Application No. 60/722,966, filed on Oct. 4, 2005, the entire content of which are hereby incorporated by reference.

FIELD OF THE INVENTION

The present invention relates to a plasma ashing method of removing a resist film from an object to be processed.

BACKGROUND OF THE INVENTION

In an exemplary semiconductor manufacturing process, an etching process is performed by using a predetermined processing gas while using as a mask a resist film having trenches and holes, which is patterned on the surface of an object to be processed such as a semiconductor wafer (hereinafter referred to as a "wafer"), and then an ashing process is performed to remove the remaining resist film.

For such an ashing process, a method of ashing and removing a resist film (plasma ashing method) by using a processing gas such as $O_2$ gas, CO gas or $CO_2$ gas is known (see, for example, Japanese Patent Laid-open Application Nos. 2003-59911 and 2001-189302). In detail, for example, by introducing $O_2$ gas into a processing chamber and generating plasma while heating a wafer in the processing chamber, the resist film is removed by using active species such as oxygen radicals that are generated when the $O_2$ gas is converted into plasma.

Since the ashing process is performed after the etching process as described above, it is possible to save the time normally required to transfer the wafer to another processing chamber if both etching and ashing processes can be continuously performed in the same processing chamber, resulting in an advantage in which the total process time can be reduced.

However, when a fluorine-containing gas (for example, a CF based processing gas) is used as the processing gas in the etching process, there is a concern that reaction products such as fluorine polymer (for example, CF based polymer) will be deposited on inner walls of the processing chamber. If the ashing process is continuously performed under such a condition, there occurs a phenomenon known as "memory effect" in which the reaction products deposited on the inner walls of the processing chamber, such as the fluorine polymer, become dissociated again and, thus, films on the wafer are etched, so that the quality of the semiconductor device to be formed on the wafer may be degraded. Such a phenomenon occurs when $CO_2$ gas, CO gas or $O_2$ gas is used as the processing gas when performing the ashing process.

Meanwhile, in order to suppress the memory effect, a method of performing the ashing process in two steps is used (see, for example, Japanese Patent Laid-open Application No. H11-145111). First, in the first step, $O_2$ gas is introduced into a processing chamber to remove reaction products without the application of a bias voltage on the wafer, and oxygen plasma is generated, thereby removing the reaction products such as fluorine polymer, deposited on the processing chamber. Thereafter, in the second step, a bias voltage is applied to the wafer and then an ashing gas is introduced into the processing chamber, thereby removing a resist film from the wafer. The process of removing the resist film in two such steps is referred to as "hybrid ashing."

However, in a case where a layer including a low-k film (hereinafter referred to as a "low-k film") is formed under a resist film, there is the concern that the low-k film may be damaged when hybrid ashing is simply performed while the low-k film is exposed. In detail, for example, when reaction products such as fluorine polymer, deposited on the inner walls of the processing chamber, are removed in the first step, part of the fluorine is dissociated due to the influence of an oxygen radical generated in the processing chamber and is inserted into the low-k film or an underlying film of the low-k film. In this case, the low-k film or the underlying film of the low-k film is etched, or C (Carbon) atoms contained in the low-k film are separated therefrom and film properties are changed, thereby increasing the dielectric constant.

Although it is also possible to suppress the damage to the low-k film or the underlying film of the low-k film by optimizing the process conditions of the first step, thus reducing the density of oxygen radicals in the processing chamber (see, for example, Japanese Patent Laid-open Application No. 2005-101289), there is a limitation in further suppressing the damage to them.

SUMMARY OF THE INVENTION

It is, therefore, an object of the present invention to provide a plasma ashing method capable of suppressing a damage to a low-k film or an underlying film formed on an object to be processed to a level below the conventional level.

In accordance with one aspect of the present invention, there is provided a plasma ashing method of removing a patterned resist film in a processing chamber after etching a portion of a low-k film from an object to be processed in the processing chamber by using the patterned resist film as a mask, the method including: a first step of supplying a reaction product removal gas including at least $CO_2$ gas into the processing chamber, generating plasma of the reaction product removal gas by applying a high frequency power for the plasma generation, and removing reaction products deposited on an inner wall of the processing chamber; and a second step of supplying an ashing gas into the processing chamber, generating plasma of the ashing gas by applying a high frequency power for the plasma generation, and removing the resist film.

Preferably, the reaction product removal gas is $CO_2$ gas or includes $CO_2$ gas and inert gas. Further, preferably, a pressure in the processing chamber in the first step is equal to or lower than 30 mTorr. Further, preferably, the ashing gas includes any or both of $O_2$ gas and $CO_2$ gas. Further, preferably, the first step is performed without any high frequency power for bias voltage generation being applied, and the second step is performed with a high frequency power for bias voltage generation being applied. Further, preferably, the low-k film is a porous low-k film.

The inventors employed a processing gas containing $CO_2$ gas as a gas for removing reaction products generated in the first ashing process based on an observation that the processing gas containing $CO_2$ gas causes less damage to a low-k film formed on an object to be processed or an underlying film thereof compared to a processing gas containing $O_2$ gas and a finding that reaction products deposited on the inner walls of the processing chamber can also be sufficiently removed by $CO_2$ gas. In comparison of this case to the case of employing the processing gas containing $O_2$ gas in the first ashing process, the damage occurring on the low-k film of the object to be processed or the underlying film thereof in the first ashing process can be remarkably reduced. Furthermore, since the reaction products are removed from the inner walls of the processing chamber by using the first ashing process, the reaction products are hardly dissociated again in the subsequent second ashing process to cause any damage to the low-k film of the object to be processed and the underlying film thereof.

In accordance with another aspect of the present invention, there is provided plasma ashing method of removing a patterned resist film in a processing chamber after etching a portion of a low-k film of an object to be processed on a second electrode facing a first electrode in the processing chamber by using the patterned resist film as a mask, the method including: a first step of supplying a reaction product removal gas including at least $CO_2$ gas into the processing chamber, generating plasma of the reaction product removal gas by applying a high frequency power to the first electrode, and removing reaction products deposited on an inner wall of the processing chamber without any high frequency power being applied to the second electrode; and a second step of supplying an ashing gas into the processing chamber, generating plasma of the ashing gas by applying a high frequency power to the first electrode, and removing the resist film with a high frequency power being applied to the second electrode. In this manner, even when a first and a second step are carried out in the processing chamber in which the first electrode is installed to face the second electrode, a damage to the low-k film or an underlying film of the object to be processed can be reduced significantly.

Preferably, in the second step, a frequency of the high frequency power applied to the first electrode is identical to that of the high frequency power applied to the second electrode, and ranges from 13 MHz to 40 MHz. Further, preferably, in the second step, a frequency of the high frequency power applied to the first electrode is equal to or higher than 27 MHz, and a frequency of the high frequency power applied to the second electrode ranges from 13 MHz to 40 MHz. Further, preferably, in the second step, a pressure in the processing chamber is equal to or lower than 400 mTorr. In this manner, since it is possible to set the frequency of the high frequency power and the pressure in the processing chamber in optimal ranges, the damage to the low-k film formed on the object to be processed or the underlying film thereof in the first step and the second step can also be reduced, so that a high speed ashing can be performed in the second step.

In accordance with still another aspect of the present invention, there is provided plasma ashing method of removing a patterned resist film in a processing chamber after etching a portion of a low-k film of an object to be processed on a second electrode facing a first electrode in the processing chamber by using the patterned resist film as a mask, the method including: a first step of supplying a reaction product removal gas including at least $CO_2$ gas into the processing chamber, generating plasma of the reaction product removal gas by applying a high frequency power to the first electrode, and removing reaction products deposited on an inner wall of the processing chamber without any high frequency power being applied to the second electrode; and a second step of supplying an ashing gas into the processing chamber, generating plasma of the ashing gas by applying a high frequency power to the second electrode without applying any high frequency power to the first electrode, and removing the resist film with the high frequency power being applied to the second electrode.

As describes above, in the second ashing process, the plasma of the ashing gas can be generated by applying the high frequency power to the second electrode without applying the high frequency power to the first electrode. By doing this, it is possible to generate the plasma of the ashing gas immediately above the object to be processed, therefore the number of ions can be increased and, thus, the ashing of the resist film can be performed at a higher speed.

Preferably, in the second step, a frequency of the high frequency power applied to the second electrode ranges from 13 MHz to 40 MHz. Further, preferably, in the second step, a pressure in the processing chamber is equal to or lower than 400 mTorr.

In accordance with still another aspect of the present invention, there is provided a plasma ashing method of removing a patterned resist film in a processing chamber after etching a portion of a low-k film of an object to be processed on an electrode by using the patterned resist film as a mask, the electrode being capable of being supplied with a first high frequency power and a second high frequency power having a frequency lower than that of the first high frequency power in an overlapping fashion, the method including: a first step of supplying a reaction product removal gas including at least $CO_2$ gas into the processing chamber, generating plasma of the reaction product removal gas by applying the first high frequency power to the electrode, and removing reaction products deposited on an inner wall of the processing chamber without the second high frequency power being applied to the electrode; and a second step of supplying an ashing gas into the processing chamber, generating plasma of the ashing gas by applying the first high frequency power to the electrode, and removing the resist film with the second high frequency power being applied to the electrode. In this manner, even if the first and second ashing processes are performed in the processing chamber having an electrode for applying the first high frequency power and the second high frequency power having a frequency lower than that of the first high frequency power in an overlapping fashion, it is possible to remarkably reduce the low-k film formed on the object to be processed or the underlying film thereof.

Preferably, in the first step, a frequency of the first high frequency power is equal to or higher than 13 MHz. Further, preferably, in the first step, a frequency of the first high frequency power is equal to or higher than 27 MHz. Further, preferably, in the second step, a frequency of the first high frequency power ranges from 13 MHz to 100 MHz. Further, preferably, in the second step, the second high frequency power is 0 W. Further, preferably, in the second step, a frequency of the first high frequency power is equal to or higher than 40 MHz, and a frequency of the second high frequency power is equal to or lower than 13 MHz. In this manner, since it is possible to set the frequency of the high frequency power and the pressure in the processing chamber in optimal ranges, the damage to the low-k film formed on the object to be processed or the underlying film thereof in the first ashing process and the second ashing process can also be reduced, and therefore a higher speed ashing can be performed in the second ashing process.

As a remark, in this specification, 1 Torr is 101,325/760 Pa, 1 mTorr is $10^{-3} \times 101,325/760$ Pa, and 1 sccm is $10^{-6}/60$ m³/sec.

BRIEF DESCRIPTION OF THE DRAWINGS

The above and other objects and features of the present invention will become apparent from the following description of preferred embodiments given in conjunction with the accompanying drawings, in which:

FIG. 6 offers a view showing the results of the measurement of plasma emission spectra in a processing chamber after a first ashing process;

DETAILED DESCRIPTION OF THE PREFERRED EMBODIMENTS

Figure 1:
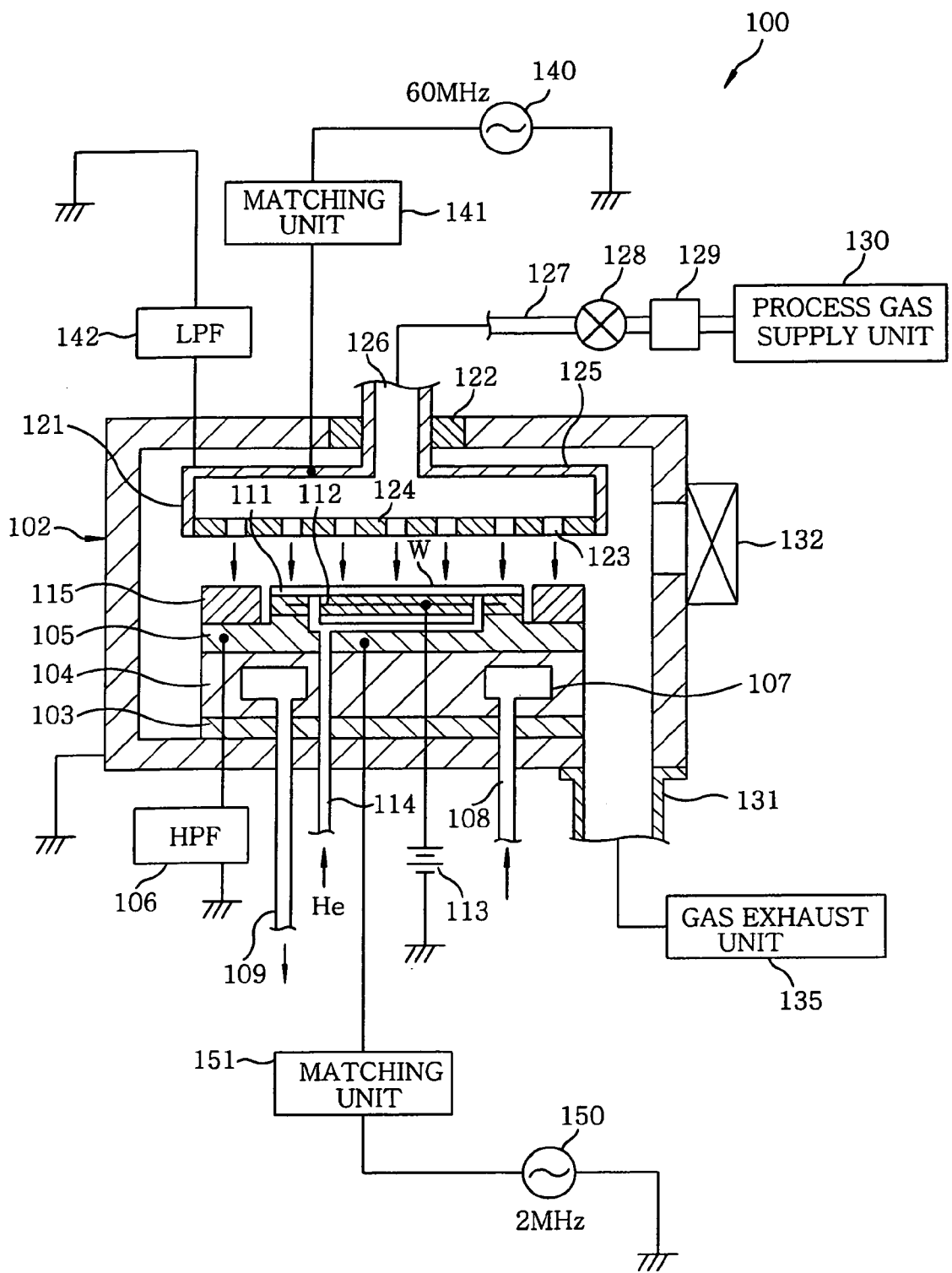
FIG. 1 shows a schematic configuration of a plasma processing apparatus in accordance with a first embodiment of the present invention.

Preferred embodiments of the present invention will now be described in detail with reference to the accompanying drawings, wherein like parts appearing in the drawings are represented by like reference numerals.

(Example of a Configuration of a Plasma Processing Apparatus in Accordance with a First Embodiment of Present Invention)

First, an example of the configuration of a plasma processing apparatus 100 in accordance with a first embodiment of the present invention will be described with reference to the drawing. FIG. 1 illustrates the schematic configuration of the plasma processing apparatus 100 in accordance with the first embodiment. The plasma processing apparatus 100 includes an upper electrode as a first electrode, and a lower electrode as a second electrode, which is located to face the first electrode. This plasma processing apparatus is a parallel plate plasma processing apparatus.

As shown in FIG. 1, the plasma processing apparatus 100 has a processing chamber 102 that is formed of a processing container formed in a cylindrical shape the surface of which is made of anodized aluminum (alumite-treated aluminum), wherein the processing chamber 102 is grounded. A susceptor support 104 is provided on a bottom of the processing chamber 102 through an insulating plate 103 such as a ceramic plate. The susceptor support 104 has a substantially circular shape and is used to support an object to be processed, for example, a semiconductor wafer (hereinafter referred to as a "wafer") thereon. A susceptor 105 serving as a lower electrode is provided on the susceptor support 104. A high pass filter (HPF) 106 is connected to the susceptor 105.

A temperature control medium container 107 is provided inside the susceptor support 104. A temperature control medium (for example, refrigerant) is introduced into the temperature control medium container 107 through an inlet line 108, is circulated and is discharged through an exhaust line 109. By circulating such a temperature control medium, it is possible to control the susceptor 105 to be maintained at a desired temperature.

The susceptor 105 has an upper central portion that is formed in a protruding disk shape. An electrostatic chuck 111 whose shape is substantially similar to a wafer W is provided on the susceptor 105. The electrostatic chuck 111 is made of an insulating material and has a configuration in which an electrode 112 is inserted therein. A DC voltage of, for example, 1.5 kV, is applied to the electrostatic chuck 111 from a DC power supply 113 connected to the electrode 112, which makes the wafer W be electrostatically attached to the electrostatic chuck 111.

A gas channel 114 for providing a heat conduction medium (for example, backside gas, such as He gas) to the rear surface of the wafer W is formed through an insulating plate 103, the susceptor support 104, the susceptor 105, and the electrostatic chuck 111. Heat transfer is performed between the susceptor 105 and the wafer W through the heat conduction medium, so that the wafer W is maintained at a desired temperature.

A focus ring 115 having a ring shape is disposed in the upper circumference of the susceptor 105 so as to surround the wafer W mounted on the electrostatic chuck 111. The focus ring 115 is made of insulating material such as ceramic or quartz, or conducting material. The uniformity of etching is improved by the focus ring 115.

An upper electrode 121 is disposed above the susceptor 105 to face it substantially in parallel thereto. The upper electrode 121 is supported in the processing chamber 102 through an insulating member 122. The upper electrode 121 includes an electrode plate 124 which faces the susceptor 105 and has a number of gas injection openings 123 therein, and an electrode supporting member 125 which supports the electrode plate 124. The electrode plate 124 is made of an insulating material or conducting material. In the present embodiment, silicon is used as the constituent material of the electrode plate 124. The electrode supporting member 125 is made of conducting material, such as aluminum, the surface of which is alumite-processed. Furthermore, the gap between the susceptor 105 and the upper electrode 121 can be controlled to be adjusted.

In the upper electrode 121, a gas inlet opening 126 is disposed in the center of the electrode supporting member 125. A gas supply line 127 is connected to the gas inlet opening 126. Further, a processing gas supply source 130 is connected to the gas supply line 127 through a valve 128 and a mass flow controller 129.

From the processing gas supply source 130 are supplied processing gases, for example, a plasma etching gas, a reaction product removal gas for ashing (which will be described later), and an ashing gas. Although a single processing gas supply system that includes the gas supply line 127, the valve 128, the mass flow controller 129 and the processing gas supply source 130 is shown in FIG. 1, the plasma processing apparatus 100 can include a plurality of processing gas supply systems. For example, processing gases, such as $CF_4$, $O_2$, $N_2$, $CHF_3$, $CO_2$, Ar, He and Xe, can be supplied into the processing chamber 102, wherein respective flow rates can be independently controlled.

A gas exhaust line 131 is connected to the bottom of the processing chamber 102, and a gas exhaust unit 135 is connected to the gas exhaust line 131. The gas exhaust unit 135 includes a vacuum pump such as a turbo molecular pump, and controls the processing chamber 102 to be maintained at a decompressed atmosphere. A gate valve 132 is provided on a side wall of the processing chamber 102. While the gate valve 132 is opened, it is possible to carry the wafer W into and out of the processing chamber 102.

A first high frequency power supply 140 is connected to the upper electrode 121, and a first matching unit 141 is inserted into a feeding line. Furthermore, a low pass filter 142 is connected to the upper electrode 121. The first high frequency power supply 140 can output a first high frequency power (high frequency power for plasma generation) having a frequency range from 50 to 150 MHz. By applying the first high frequency power having such a high frequency to the upper electrode 121, high density plasma can be formed in the processing chamber 102 in a desired state of dissociation, so that it becomes possible to perform the plasma process under a low pressure condition. The desired frequency of the first high frequency power from the first high frequency power supply 140 preferably ranges from 50 MHz to 80 MHz, and is typically 60 MHz or a frequency close thereto, as shown in FIG. 1.

A second high frequency power supply 150 is connected to the susceptor 105 serving as a lower electrode, and a second matching unit 151 is inserted into the feeding line thereof. The second high frequency power supply 150 can output a second high frequency power (bias voltage generation high frequency power) having a frequency range from hundreds of kHz to tens of MHz. By applying the second high frequency power, having such a frequency range, to the susceptor 105, it is possible to make an ion act on the wafer W without damaging it. The frequency of the second high frequency power from the second high frequency power supply 150 is 2 MHz, 3.2 MHz or 13.56 MHz, typically as shown in FIG. 1. In the present embodiment, the frequency is set to 2 MHz.

Although the second high frequency power is normally applied as a high frequency power for the generation of a bias voltage, the second high frequency power may be used as the high frequency power for the generation of plasma in case when the first high frequency power is not applied. Accordingly, since it is possible to generate the plasma of the ashing gas immediately above the wafer, it is possible to increase the number of generated ions required for ashing (which will be described later), so that the ashing of the resist film can be performed at a higher speed.

(Detailed Example of Film Structure of Wafer)

Next, a detailed example of the film structure of a wafer to be etched and ashed by using the plasma processing apparatus 100 shown in FIG. 1 will be described with reference to FIG. 2.

Figure 2:
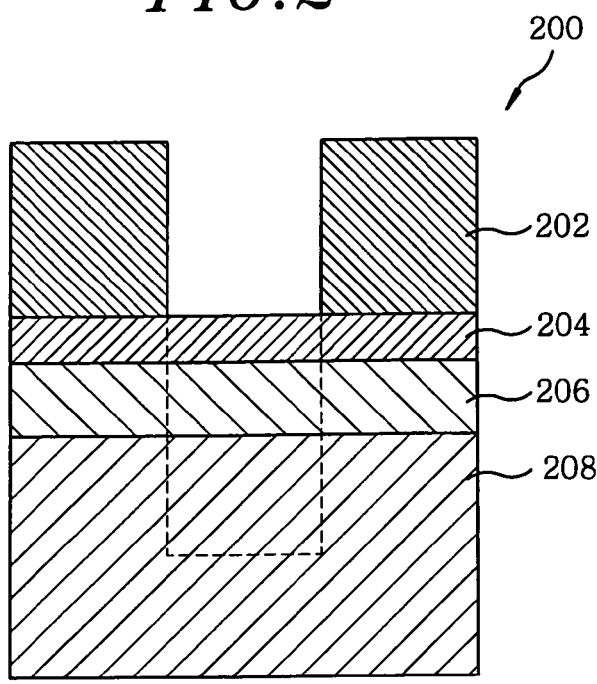
FIG. 2 illustrates a schematic sectional view showing the film structure of a wafer that is etched and ashed by using the plasma processing apparatus shown in FIG. 1.

As shown in FIG. 2, a wafer 200 includes a film structure in which a low dielectric constant film 208 (hereinafter referred to as a "low-k film"), a protective film 206, a bottom anti-reflective coat (BARC) 204, and a photoresist film 202 are sequentially stacked. Furthermore, a metallic layer, such as a Cu wiring layer, and various semiconductor layers may be formed under the low-k film 208 and on a silicon substrate of the main body of the wafer 200, in addition to an etching stop film made of SIC material, such as a SiCN film or a SiC film.

For example, a porous low-k film may be used as the low dielectric constant material in forming the low-k film 208. In order to deal with problems such as wiring delay due to the reduction in the design rule of a semiconductor integrated circuit, a porous structure, such as a porous low-k film, is used as interlayer insulating films. By this, it is possible to further reduce a dielectric constant of the interlayer insulating films.

Such a porous low-k film includes a porous coating film having a siloxane structure, such as Hydrogen-Silses-Quioxane (HSQ) or Methyl-hydrogen-Silses-Quioxane (MSQ), and a porous CVD film, such as a SiOCH film. Of these films, the SiOCH film is often labeled as a SiOC film, and typically includes Si, O, C and H as constituent elements. In the present embodiment, a porous low-k film formed of a SiOCH film, whose relative dielectric constant K is 2.5, is used as the low-k film 208, and the film thickness of the low-k film 208 is 480 nm.

Furthermore, the coating film having the porous structure described above is formed, for example, as follows. The coating film is formed by spin-coating a solution containing the precursor and template of insulating film material onto a substrate, and then making it porous by using heat treatment. The CVD film having the porous structure is formed under conditions selected for suitability, such as the type of film-forming gas and the like.

Furthermore, there is concern that the porous low-k film will have reduced adhesiveness to another film and a degraded film strength because the insulating film is porous. Accordingly, in the case where the porous low-k film is used as the low-k film 208, a protective film 206 is used on the low-k film 208. The protective film 206 includes a SiCN film and a $SiO_2$ film. In the present embodiment, the SiCN film is used as the protective film 206, and the thickness thereof is 120 nm. Although the porous low-k film is given as an example of the low-k film formed on the wafer, the low-k film is not limited to the porous low-k film.

Resist material used in forming the photoresist film 202 is sensitive to, for example, KrF light (having a wavelength of 248 nm), and the film thickness thereof is 410 nm. A line-and-space (trench) pattern, in which the ratio of a line width to an interline width is 1:2 and a line width is 200 nm, is formed in advance by using a lithography process.

The bottom anti-reflective film 204 functions to suppress light reflected from the underlying layer when the photoresist film 202 is exposed to KrF light. Accordingly, a finer patterning can be performed. In the present embodiment, the thickness of the bottom anti-reflective coat 204 is 60 nm.

(Detailed Example of Process Performed on Wafer)

A detailed example of the process performed on the wafer 200 shown in FIG. 2 by using the plasma processing apparatus 100 illustrated in FIG. 1 is described below. First, the wafer 200 illustrated in FIG. 2 is carried into the processing chamber 102 of the plasma processing apparatus 100 shown in FIG. 1, and a plasma etching process is performed on the wafer 200. As a result, the bottom anti-reflective coat 204, the protective film 206, and the low-k film 208 are etched, so that a trench 210 is formed (refer to FIG. 3). For example, the ratio of line width to interline width is 1:2 and the line width is 200 nm. Subsequently, the plasma ashing process in accordance with the present invention is performed on the wafer 200 in the same processing chamber 102. By doing this, the photoresist film 202 and the bottom anti-reflective coat 204 are removed (refer to FIG. 4).

A detailed example of the plasma ashing process is described below. Here, the plasma etching process is performed by sequentially performing first to third etching processes. First, in the first etching process, etching is performed on the bottom anti-reflective coat 204 by using the patterned photoresist film 202 as a mask. The process conditions under which the first etching process is performed are such that the pressure in the processing chamber 102 is maintained at 50 mTorr and the levels of the high frequency powers applied to the upper electrode 121 and the susceptor (lower electrode) 105 are 1000 W and 100 W, respectively. Furthermore, $CF_4$ gas is used as the processing gas and the flow rate thereof is 100 sccm. Moreover, the pressures of the rear surface cooling gas (backside gas) for the wafer 200 are 10 Torr at the center portion thereof and 35 Torr at the edge portion thereof. The process time of the first etching process is, for example, 60 sec.

Next, in the second etching process, etching is performed on the protective film 206 by using the patterned photoresist film 202 as a mask. The process conditions under which the second etching process is performed are such that the pressure in the processing chamber 102 is maintained at a pressure of 50 mTorr and both of high frequency powers applied to the upper electrode 121 and the susceptor (lower electrode) 105 are 500 W. Further, a gaseous mixture of $C_4F_8$, Ar and $N_2$ is used as the processing gas and the ratio of the flow rates of respective gases is 5 sccm/100 sccm/100 sccm. Furthermore, the pressures of the rear surface cooling gas (backside gas) for the wafer 200 are 10 Torr at the center portion thereof and 35 Torr at the edge portion thereof. The process time of the second etching process is, for example, 60 sec.

Next, in the third etching process, etching is performed on the low-k film 208. The process conditions under which the third etching process is performed are such that the pressure in the processing chamber 102 is maintained at 75 mTorr and the levels of high frequency powers applied to the upper electrode 121 and the susceptor (lower electrode) 105 are 1000 W and 300 W, respectively. Furthermore, a gaseous mixture of $CF_4$ and Ar is used as the processing gas and the ratio of flow rates of respective gases are 100 sccm/100 sccm (the flow rate of $CF_4$/the flow rate of Ar). Further, the pressures of the rear surface cooling gas (backside gas) for the wafer 200 are 10 Torr at the center portion thereof and 35 Torr at the edge portion thereof. The process time of the third etching process is, for example, 70 sec.

Figure 3:
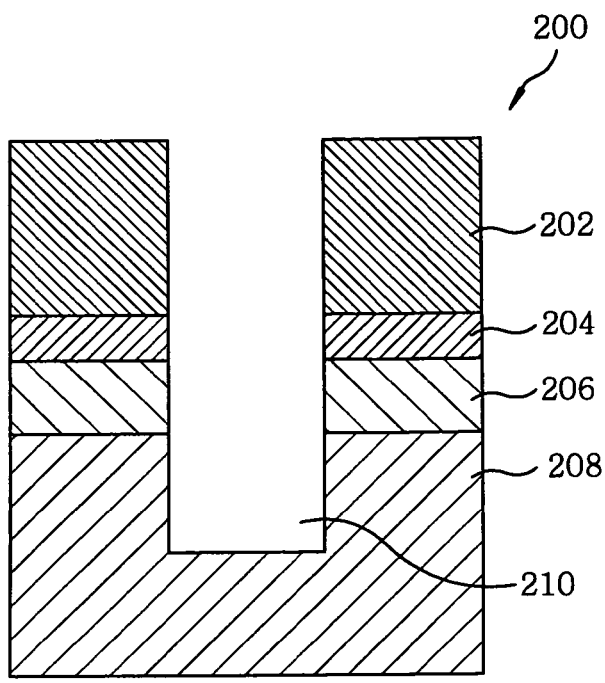
FIG. 3 presents a schematic sectional view showing the film structure obtained after the wafer shown in FIG. 2 is etched.

Using the plasma etching process including the first to third etching processes, the trench 210 is formed in the low-k film 208, for example, as shown in FIG. 3. For example, the ratio of the line width to the interline width for the trench 210 is 1:2, and the line width is 200 nm. Following the plasma etching process, a plasma ashing process for removing the photoresist film 202 is performed on the wafer 200 in the same processing chamber 102.

However, while the plasma etching process described above is performed, fluorine F contained in the processing gas is attached to the inner walls of the processing chamber 102, and is gradually deposited as fluorine polymer. If the plasma ashing process of removing the photoresist film 202 is performed directly at this state, the fluorine polymer deposited on the inner walls of the processing chamber 102 is dissociated again and the low-k film is etched, thus the width and depth of the trench are changed.

To deal with such a problem, the plasma ashing process in accordance with the present embodiment is divided into two processes to be performed sequentially; that is, a first ashing process of mainly removing reaction products such as fluorine polymer (for example, CF fluorine polymer) deposited on inner walls of the processing chamber 102, and a second ashing process of removing the photoresist film 202. First, by performing the first ashing process, the fluorine polymer deposited on the inner walls of the processing chamber 102 is removed. Thereby, in the subsequent second ashing process, it is possible to prevent the fluorine polymer from being dissociated again and the low-k film 208 from being etched.

However, if a conventional processing gas whose main gas is $O_2$ is used as a reaction product removal gas in the first ashing process of the plasma ashing process, the low-k film or the underlying film thereof (for example, an etching stop film) is liable to be damaged. For example, when the fluorine polymer deposited on the inner walls of the processing chamber 102 is removed, there is concern that part of the fluorine is dissociated again by O radicals generated in the chamber, and is inserted into the low-k film or the underlying film thereof, thereby chipping pieces from the low-k film or the underlying film thereof or deteriorating the low-k film, and, finally, increasing the dielectric constant thereof. Furthermore, in the first ashing process, C (carbon) atoms contained in the low-k film are removed by the O radicals generated in the processing chamber 102 due to oxygen plasma, so that the low-k film is deteriorated, resulting in an increase in the dielectric constant (k value) of the low-k film.

In this case, although the damage to the low-k film or the underlying film thereof can be suppressed by optimizing the process conditions of the first ashing process and, thereby, reducing the density of O radicals in the processing chamber 102, there is a limitation in the suppression of the damage to the low-k film or the underlying film thereof.

Therefore, from the results of repeated experiments on the reaction product removal gas used in the first ashing process, the inventors of the present invention have discovered that, if a processing gas that contains $CO_2$ gas as a main gas is employed as the reaction product removal gas in the first ashing process, it can remove reaction products such as fluorine polymer, deposited on the inner walls of the processing chamber 102 as efficiently as the processing gas that contains $O_2$ gas as a main gas.

It may be inferred that, for example, when the processing gas that contains $CO_2$ gas as a main gas is converted into plasma, $CO_2^+$ ($CO_2$ ion) are generated, and the $CO_2$ ions are accelerated due to the potential difference between the plasma and the inner walls of the processing chamber 102, collide with the inner walls, are scattered across the surface of the inner walls, and then are vaporized into CO gas or $COF_2$ gas through the chemical reaction expressed in the following chemical formulae Eqs. 1-1 and 1-2, so that the fluorine polymer (for example, CF based fluorine polymer) deposited on the inner walls of the processing chamber 102 is removed.

$$CO_2^+ + CF_2 + e^- \rightarrow CO\uparrow + COF_2\uparrow \qquad \text{Eq. 1-1}$$

$$CO_2^+ + C + e^- \rightarrow 2CO\uparrow \qquad \text{Eq. 1-2}$$

Furthermore, it is also found that the case of using the processing gas that contains $CO_2$ gas as a main gas in the first ashing process can more effectively suppress the damage to the low-k film or the underlying film thereof than the case of using the processing gas that contains $O_2$ gas as a main gas. The reasons for this seem to be that the case of using the processing gas that contains $CO_2$ gas as a main gas is less likely to generate O radical in comparison to the case of using the processing gas that contains $O_2$ gas as a main gas, and $CO_2$ is very stable and is not capable of removing carbon atoms from the low-k film by itself, and therefore it is difficult to damage the low-k film or the underlying film thereof.

Therefore, in the plasma ashing process method in accordance with the present invention, the processing gas that contains $CO_2$ gas as a main gas is used as the reaction product removal gas in the first ashing process. By doing this, it is possible to suppress the damage to the low-k film or the underlying film thereof (for example, the etching of the low-k film or the like or the degradation of the low-k film) below the conventional level. Furthermore, by removing deposits such as fluorine polymer deposited on the inner walls of the processing chamber 102 by using the first ashing process and by using the processing gas that contains $CO_2$ gas as a main gas as the ashing gas in the subsequent second ashing process, it is possible to ensure the effect of suppressing the damage to the low-k film or the underlying film thereof.

Furthermore, by optimizing other parameters in the process conditions of the first and second ashing processes, it is possible to further suppress the damage to the low-k film or the underlying film thereof, resulting in maintaining the film quality of the low-k film 208 in a more preferable state.

Hereinafter, an example of the process conditions applied to the plasma ashing process is described. First, the process conditions under which the first ashing process is performed in the plasma ashing process are such that the pressure in the processing chamber 102 is 20 mTorr, the gap between the upper electrode 121 and the susceptor 105 is 35 mm, the high frequency power (for example, at a frequency of 60 MHz) applied to the upper electrode 121 is 300 W, and the high frequency power applied to the susceptor (lower electrode) 105 is 0 W (that is, high frequency power is not applied to the susceptor 105). Furthermore, $CO_2$ gas is used as the processing gas, and the gas flow rate of $CO_2$ is 750 sccm. Moreover, the pressure of rear surface cooling gas (backside gas) for the wafer 200 is 15 Torr at the central portion thereof, and 40 Torr at the edge portion thereof. Furthermore, the temperature set in the processing chamber 102 is 60° C. at the upper electrode, 60° C. at the side wall, and 0° C. at the lower electrode.

As for the process conditions under which the second ashing process, the pressure in the processing chamber 102 is set to 200 mTorr, the gap between the upper electrode 121 and the susceptor 105 is set to 50 mm, the high frequency power (for example, at a frequency of 2 MHz) applied to the upper electrode 121 is set to 0 W (this means that high frequency power is not applied to the upper electrode 121), and the high frequency power (for example, at a frequency of 2 MHz) applied to the susceptor (lower electrode) 105 is set to 300 W. Furthermore, $CO_2$ gas is used as the processing gas, and the flow rate of the $CO_2$ gas is 700 sccm. Moreover, the pressure of rear surface cooling gas (backside gas) for the wafer 200 is 10 Torr at the central portion thereof, and 35 Torr at the edge portion thereof. Additionally, the temperature set in the processing chamber 102 is 60° C. at the upper electrode, and 40° C. at the lower electrode.

(Experiments on Effects of Removing Reaction Products in First Ashing Process)

Hereinafter, the results of experiments performed to investigate whether reaction products such as the fluorine polymer, deposited on the inner walls of the processing chamber 102, could be removed by performing the first ashing process by using the processing gas that contained $CO_2$ gas as a main gas will be described. As a comparative example, the same experiment was performed on the first ashing process by using a processing gas that contained $O_2$ gas as a main gas. In these experiments, the amount of removed reaction products such as fluorine polymer, deposited on the inner walls of the processing chamber was indirectly measured by measuring the amount of reduction of an $SiO_2$ film by using a sample thereof (hereinafter referred to as an "$SiO_2$ blanket sample") whose front surface was covered with an $SiO_2$ film. That is, the experiments draw on the fact that, as the amount of removed reaction products such as fluorine polymer, deposited on the inner walls of the processing chamber, increases, the amount of reduction in the $SiO_2$ film of the $SiO_2$ blanket sample decreases.

In detail, first, reaction products such as fluorine polymer were deposited on the inner walls of the processing chamber 102 by performing the plasma etching process, which included the first to third etching processes, on a silicon substrate which was a dummy substrate, under the same process conditions as described above. Thereafter, the first ashing process was performed to remove the process products such as fluorine polymer, deposited on the inner walls of the processing chamber 102.

After the first ashing process, the silicon substrate was carried out of the processing chamber, the $SiO_2$ blanket sample whose $SiO_2$ film thickness had been measured in advance was carried into the processing chamber 102, a process of supplying $O_2$ gas to the processing chamber 102 at 300 sccm was performed for 60 sec, with the pressure in the processing chamber 102 being set to 15 mTorr, the high frequency power (for example, frequency of 60 MHz) applied to the upper electrode 121 being set to 300 W, and the high frequency power applied to the susceptor (lower electrode) 105 being set to 400 W, and then the amount of reduction in the $SiO_2$ film was measured.

In the case where the processing gas that contained $O_2$ gas as a main gas was used in the first ashing process of this experiment, the process conditions are described below. That is, the pressure in the processing chamber 102 was 20 mTorr, the gap between the upper electrode 121 and the susceptor 105 was 35 mm, the high frequency power (for example, at a frequency of 60 MHz) applied to the upper electrode 121 was 300 W, and the high frequency power applied to the susceptor (lower electrode) 105 was 0 W (that is, the high frequency power was not applied to the susceptor 105). Furthermore, a gaseous mixture of Ar and $O_2$ was used as the processing gas, and the ratio of gas flow rates (flow rate of Ar gas/flow rate of $O_2$ gas) was 550 sccm/200 sccm. Furthermore, the pressure of rear surface cooling gas (backside gas) for the $SiO_2$ blanket sample was 15 Torr at the central portion thereof and 40 Torr at the edge portion thereof. Furthermore, for the temperature set in the processing chamber 102, the temperature of the upper electrode, the temperature of the side wall portion and the temperature of the lower electrode were set to be 60° C., 60° C. and 0° C., respectively.

In the case where the processing gas that contained $CO_2$ gas as a main gas was used in the first ashing process of this experiment, the process conditions were such that the processing gas that contained $O_2$ gas as a main gas was changed to a simple $CO_2$ gas and the flow rate of $CO_2$ gas was set to 750 sccm.

Figure 5:
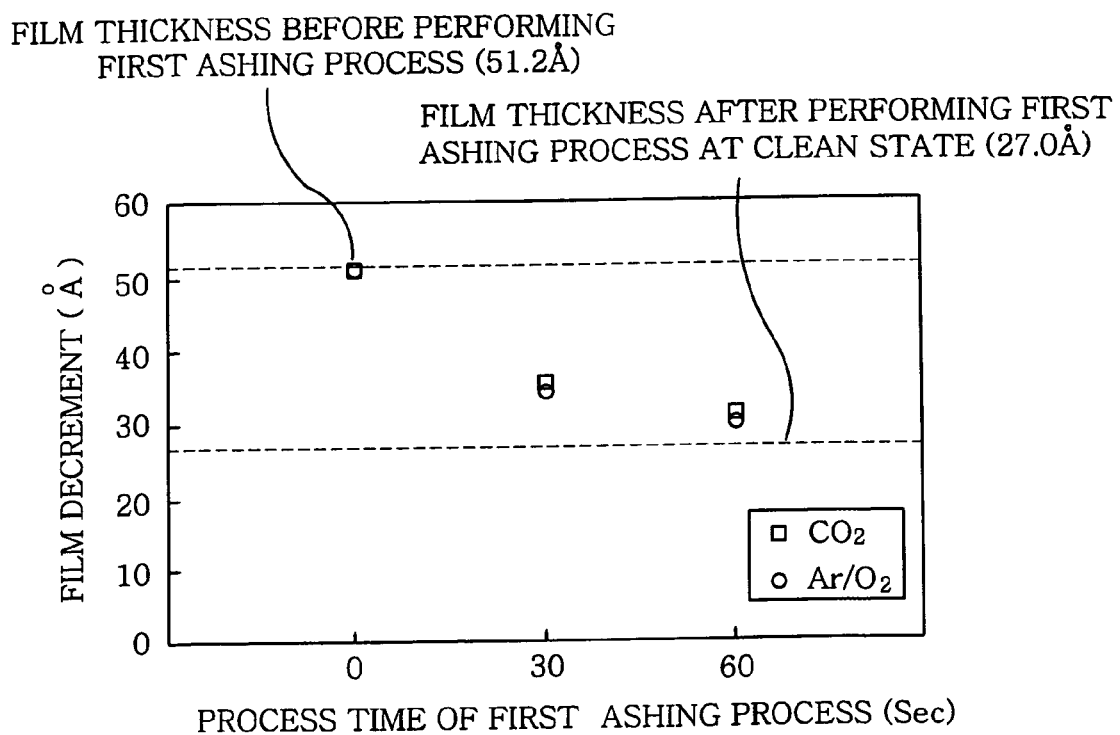
FIG. 5 depicts a view showing the results of the measurement of the amounts of the removal of reaction products in a first ashing process that were indirectly measured by measuring the amounts of the reduction of a film.

The results of the measurement of the amounts of reduction of the film are shown in FIG. 5. In FIG. 5, plots indicated by "○" represent the amounts of reduction of the film in the case where a gaseous mixture of Ar and $O_2$ was used as the processing gas in the first ashing process, and plots indicated by "□" represent the amounts of reduction of the film in the case where simple $CO_2$ gas was used as the processing gas. In this experiment, the amounts of reduction of the film were measured and plotted after the first ashing processes using respective processing gases had been performed for 0 sec (i.e., the first ashing process had not yet been performed), 30 sec, and 60 sec. For example, the amount of reduction of the film in the case where the first ashing process was performed for 60 sec was 30.3 angstrom when the processing gas was a gaseous mixture of Ar and $O_2$, and 32.6 angstrom when the processing gas was a simple $CO_2$ gas.

The upper dotted line shown in FIG. 5 indicates the initial value of the $SiO_2$ film thickness of a $SiO_2$ blanket sample, that is, the film thickness (51.2 angstrom) before the first ashing process. The lower dotted line shown in FIG. 5 indicates the film thickness (27.0 angstrom) in the case where the ashing process was performed for, for example, 1 minute by using a gaseous mixture of Ar and $O_2$ as the processing gas in a cleaned processing chamber 102 in which the plasma etching process was not performed. Accordingly, the upper dotted line (for 51.2 angstrom) shown in FIG. 5 corresponds to the film thickness measured before the reaction products such as fluorine polymer deposited on the inner walls of the processing chamber were removed, and the lower dotted line (for 27.0 angstrom) shown in FIG. 5 corresponds to the film thickness measured after the reaction products such as fluorine polymer deposited on the inner walls of the processing chamber had been removed.

According to the experimental results shown in FIG. 5, the amounts of reduction of the film both in the case of using a gaseous mixture of Ar and $O_2$ and in the case of using simple $CO_2$ gas were almost the same. Therefore, it can be appreciated that the simple $CO_2$ gas removes reaction products such as fluorine polymer, that are deposited on the inner walls of the processing chamber, as efficiently as the gaseous mixture of Ar and $O_2$.

Next, the results of the measurement of plasma emission spectra in the processing chamber, taken after the first ashing process had been performed by using the processing gas that contained $CO_2$ gas as a main gas, are described. In the experiments shown in FIG. 5, in the measurement of the amounts of reduction of the $SiO_2$ film with respect to an $SiO_2$ blanket sample on which the first ashing process was performed for only 60 sec by using simple $CO_2$ gas as the processing gas, the results of the measurements of plasma emission spectra in the processing chamber performed when $O_2$ plasma was generated are shown in FIG. 6.

In FIG. 6, for the case in which $O_2$ plasma was generated in a cleaned processing chamber in which reaction products such as fluorine polymer were not deposited on the inner walls thereof, the results of the measurement of plasma emission spectra in the processing chamber are shown again as a comparative example. That is, in FIG. 6, the plot indicated by the thick line represents plasma emission spectra in a cleaned processing chamber, and the plot indicated by the thin line represents plasma emission spectra in the processing chamber in which the first ashing process was performed after the plasma ashing process.

In FIG. 6, a vertical axis represents emission light intensity, and a horizontal axis represents wavelength. The wavelength ranges from 500 nm to 800 nm. The plasma emission spectra were measured by using a spectroscope.

According to the experimental results shown in FIG. 6, a plasma emission spectra of the processing chamber in which, subsequently to the plasma etching process, the first ashing process was performed by using simple $CO_2$ gas as the processing gas is same as that of a cleaned processing chamber whose inner walls were not deposited with reaction products such as fluorine polymer thereon. Therefore, it is certain that the reaction products deposited on the inner walls of the processing chamber were removed through the plasma ashing process when the first ashing process was performed by using the processing gas that contained $CO_2$ gas as a main gas. Furthermore, since no other elements remained in the processing chamber, the processing chamber was in the same state as a cleaned processing chamber.

(Experiments on Effects of Suppressing Damage to Low-k Film in First Ashing Process)

Hereinafter, the results of experiments on the effects of suppressing a damage to a low-k film in the first ashing process will be described. With regard thereto, the first ashing process was performed on the wafer 200 of FIG. 3, on which the plasma etching process was performed by using the plasma processing apparatus 100 in accordance with the present invention, and the extent of the damage to the low-k film was measured.

In the present experiments, the extent of the damage to the low-k film by the first ashing process was determined based on the amount of erosion of the low-k film when the sample wafer 200 was dipped in a fluoric acid solution. This method takes advantage of the phenomenon in which a low-k film having a favorable film quality is not dissolved in the fluoric acid, whereas a low-k film whose constituent composition has been changed due to, for example, the dissociation of carbon atoms is dissolved in the fluoric acid. The method will be described in detail with reference to FIGS. 7A and 7B below.

When the plasma etching process was performed on the wafer 200 shown in FIG. 2, the trench 210 was formed in the low-k film 208 of the wafer 200 as shown in FIG. 3. Thereafter, the first ashing process was performed on the wafer 200 shown in FIG. 3. Since the photoresist film 202 was not removed in the first ashing process, the film structure of the wafer 200 was the same as that shown in FIG. 3. The wafer 200 after the first ashing process is shown in FIG. 7A.

Figure 7A:
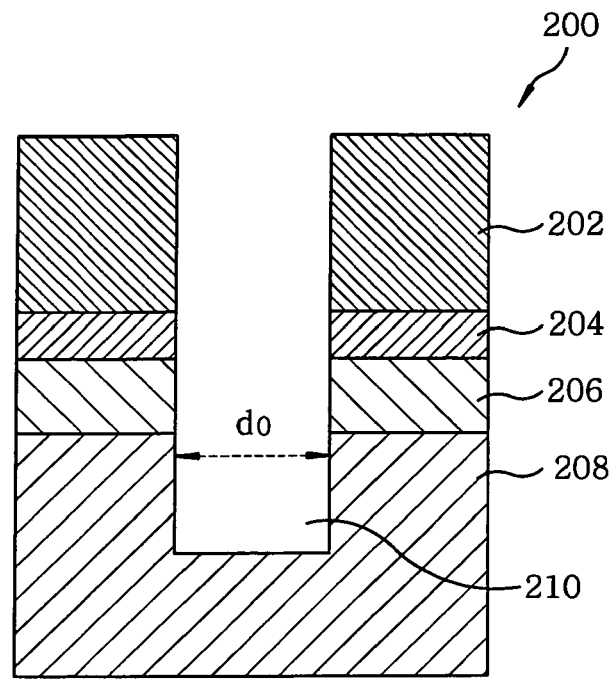
FIGS. 7A and 7B set forth views of a method of determining the extent of damage to a low-k film occurring due to a first ashing process.
Figure 7B:
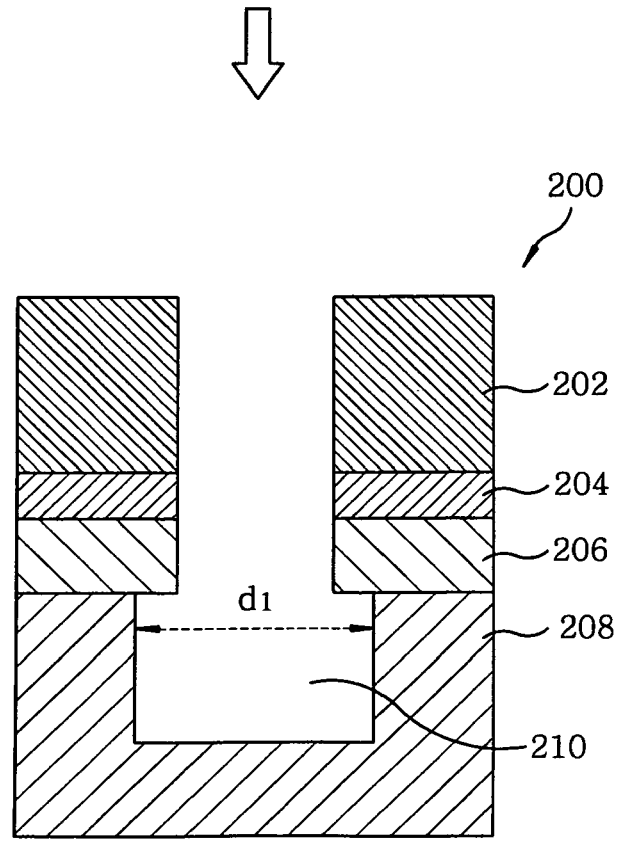

However, when the wafer 200 shown in FIG. 7A was dipped in the fluoric acid solution after the first ashing process, if the exposed wall of the low-k film 208 was damaged by the first ashing process, the exposed wall of the low-k film 208 would be partially dissolved as shown in FIG. 7B.

The amount of dissolution loss $\Delta d$ corresponds to the area of the low-k film 208 where the constituent composition was changed due to dissociated carbon atoms or the like. Therefore, the more the amount of dissolution loss $\Delta d$, the greater the damage to the low-k film 208 as a result of the first ashing process. Furthermore, the amount of dissolution loss $\Delta d$ is represented by the change in the gap width (or hole diameter), i.e., critical dimensions (CD) shift of the trench, as shown in FIGS. 7A and 7B. Therefore, in the experiment of the first ashing process, the amount of dissolution loss $\Delta d$ was the difference between the gap width (or hole diameter) $d_0$ of the trench of the low-k film 208 before it was dipped in the fluoric acid solution and the gap width (or hole diameter) $d_1$ of the trench of the low-k film after it was dipped in the fluoric acid solution (in short, $\Delta d = d_1 - d_0$). The extent of the damage to the low-k film was determined by using the amount of dissolution loss $\Delta d$ as the amount of CD shift.

By using the method of determining damage to the low-k film, the results of measuring the damage to the low-k film (that is equivalent to the amount of CD shift) in the case of using the processing gas that contained $CO_2$ gas as a main gas in the first ashing process is described. As comparative examples, the amount of CD shift before the first ashing process in the plasma etching process, and the amount of CD shift in the case of using the processing gas that contained $O_2$ gas as a main gas in the first ashing process were measured.

Furthermore, process conditions in the case of using the processing gas that contained $O_2$ gas as a main gas in the first ashing process are described as follows. That is, the pressure in the processing chamber 102 was 20 mTorr, the high frequency power (for example, at a frequency of 60 MHz) applied to the upper electrode 121 was 300 W, and the high frequency power applied to the susceptor (lower electrode) 105 was 0 W (that is, the susceptor was not supplied with the high frequency power). Furthermore, a gaseous mixture of Ar and $O_2$ was used as the processing gas, in which the ratio of flow rates of respective gases (the flow rate of Ar/the flow rate of $O_2$) was 550 sccm/200 sccm. Furthermore, the process time of the first ashing process was set to 30 sec.

The process conditions in the case of using the processing gas that contained $CO_2$ gas as a main gas in the first ashing process were the same as the above-described process conditions in the case of using the processing gas that contained $O_2$ gas as a main gas, except that the processing gas was simple $CO_2$ gas and the flow rate of $CO_2$ gas was 750 sccm. The process time of the first ashing process was 45 sec.

Figure 8:
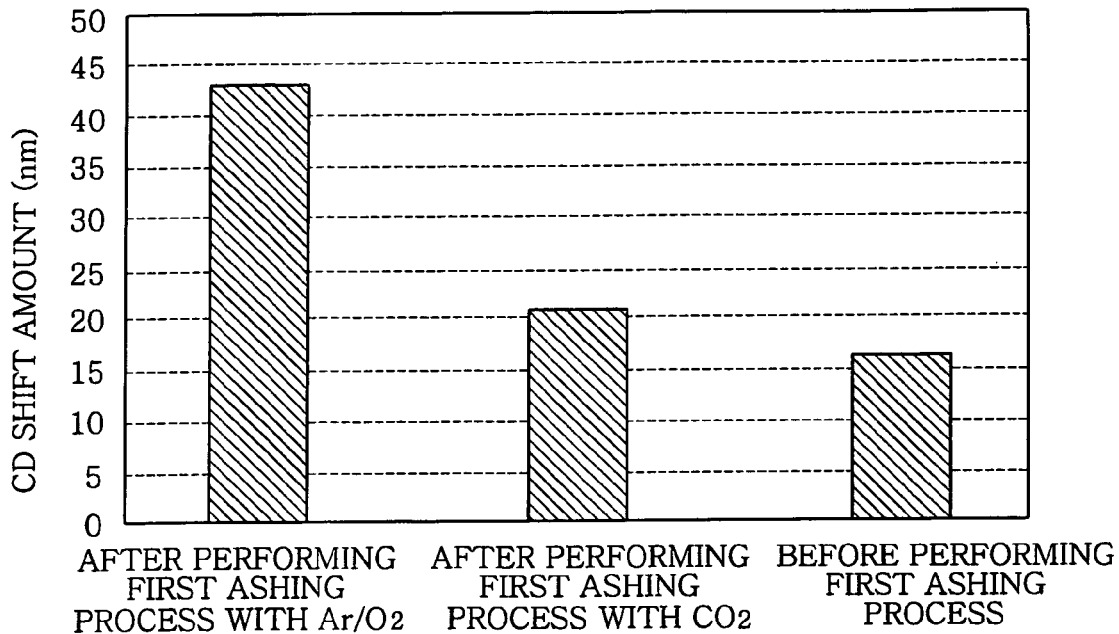
FIG. 8 shows a view showing the relationship between the type of processing gas and the amount of CD shift in the first ashing process.

The results of the measurement of the amounts of CD shift obtained as described above are shown in FIG. 8. FIG. 8 illustrates the amounts of CD shift representing the extents of the damage to the low-k film as a bar graph. According to the measurement results shown in FIG. 8, the amount of CD shift after the first ashing process, in which a gaseous mixture of Ar and $O_2$ was used as the processing gas, is reduced by approximately 50% of the amount of CD shift after the first ashing process, in which a gaseous mixture of Ar and $O_2$ was used as the processing gas. As can be seen therefrom, the case of using the simple $CO_2$ gas as the processing gas exhibits a greater effect of suppressing the damage to the low-k film than in the case of using the gaseous mixture of Ar and $O_2$ as the processing gas.

Furthermore, the amount of CD shift after the first ashing process in which simple $CO_2$ gas was used as the processing gas was approximately the same as the amount of CD shift before the first ashing process. Therefore, it can be appreciated that, in the case of performing the first ashing process in which simple $CO_2$ gas is used as the processing gas, the reaction products such as fluorine polymer deposited on the inner walls of the processing chamber can be removed without any damage to the low-k film.

(Experiments by Varying Other Parameters of First Ashing Process)

The optimal process conditions for improving the effect of reducing the damage to the low-k film 208 are described with reference to the results of experiments in which the first ashing process was performed on the wafer 200 after the plasma etching process of FIG. 3 while various parameters of the ashing process conditions were changed. In these experiments, three levels were set for each of the following parameters: the pressure in the processing chamber, the high frequency power applied to the upper electrode (also referred to as "upper power"), the electrode gap between the upper electrode 121 and the susceptor (lower electrode) 105, and the ratio (%) of flow rates $CO_2/(CO_2+Ar)$. The ashing process conditions No. 1 to No. 9 shown in Table 1, under each of which the first ashing process was performed, were prepared based on the combinations of the above-mentioned levels.

Furthermore, the pressure of a rear cooling gas (backside gas) of the wafer 200 was fixedly maintained at 10 Torr for the central portion thereof and 35 Torr for the edge portion thereof. The set temperature in the processing chamber 102 was fixedly maintained at 60° C. for the upper electrode, 50° C. for the side wall portion and 40° C. for the lower electrode.

TABLE 1

| | Pressure (mTorr) | Upper power (W) | Electrode gap (mm) | Ratio of gas flow ($CO_2/CO_2$ + Ar) (%) | Process time of first ashing process (sec) | CD shift amount $\Delta d$ (nm) |
|---|---|---|---|---|---|---|
| No. 1 | 30 | 400 | 30 | 50 | 34.8 | 18.7 |
| No. 2 | 30 | 800 | 45 | 75 | 22.8 | 19.0 |
| No. 3 | 30 | 1200 | 60 | 100 | 16.0 | 15.3 |
| No. 4 | 20 | 400 | 45 | 100 | 42.0 | 27.0 |
| No. 5 | 20 | 800 | 60 | 50 | 27.6 | 21.9 |
| No. 6 | 20 | 1200 | 30 | 75 | 21.2 | 16.3 |
| No. 7 | 10 | 400 | 60 | 75 | 48.0 | 24.8 |
| No. 8 | 10 | 800 | 30 | 100 | 27.6 | 17.0 |
| No. 9 | 10 | 1200 | 45 | 50 | 26.0 | 16.0 |

Figure 9:
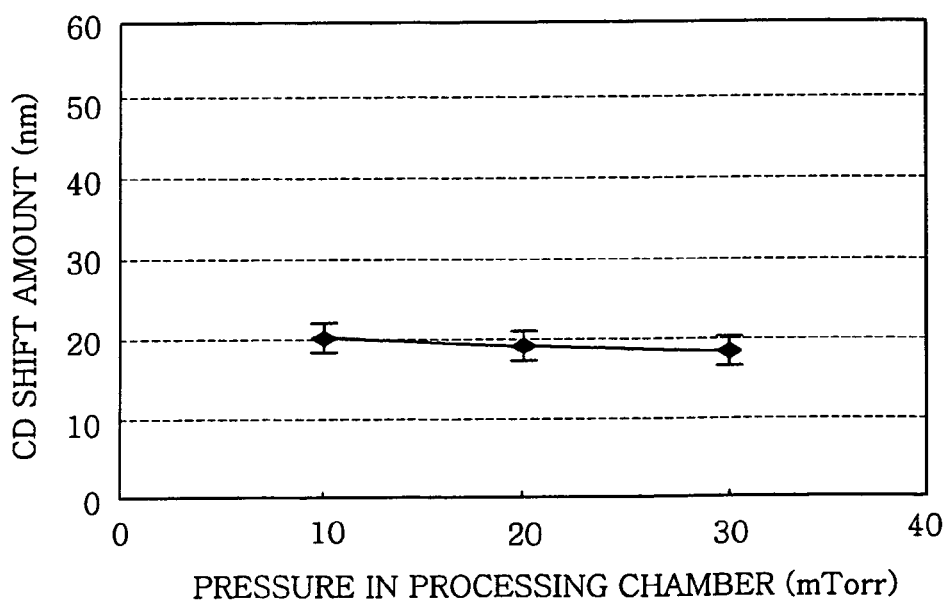
FIG. 9 describes a view showing the relationship between the pressure in the processing chamber and the amount of CD shift in the first ashing process.

The results obtained by the experiments on the first ashing process will be described. First, the relationship between pressure in the processing chamber and the amount of CD shift is illustrated in FIG. 9. In detail, FIG. 9 is a broken line graph showing the amounts of CD shift in the case where the pressure levels in the processing chamber were 30 mTorr, 20 mTorr, and 10 mTorr, respectively, in Table 1. That is, FIG. 9 plots the averages of the amounts of CD shift at the respective pressure levels in the processing chamber. According to the experimental results of FIG. 9, a desired result in which the amounts of CD shift were almost the same and could be suppressed below approximately 20 nm when the pressure in the processing chamber ranged from 10 mTorr to 30 mTorr could be obtained. Accordingly, it is preferred that the pressure in the processing chamber be below 30 mTorr.

Figure 10:
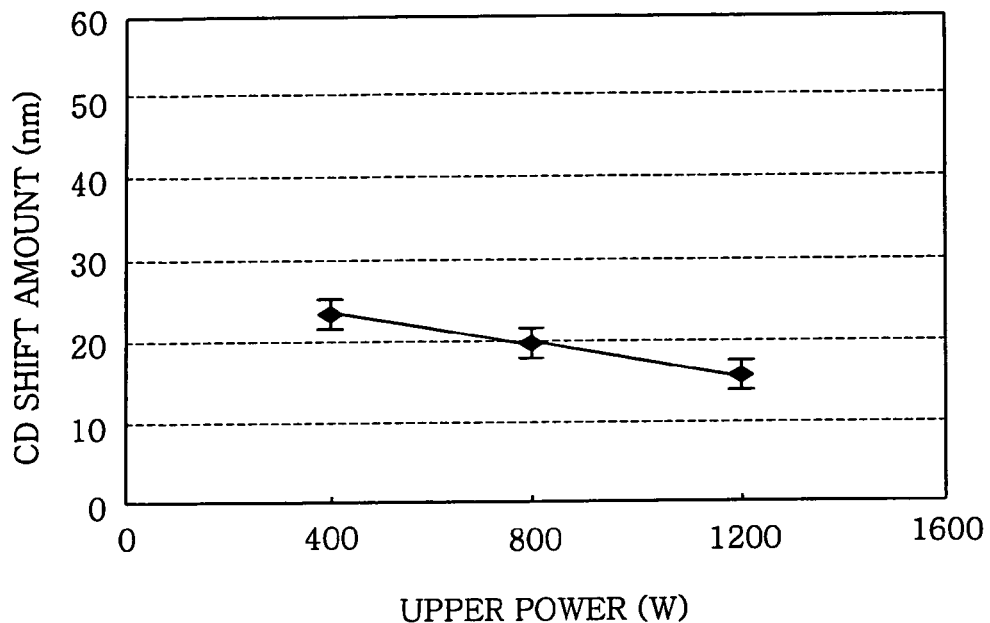
FIG. 10 is a view showing the relationship between the upper power and the mount of CD shift in the first ashing process.

Next, the relationship between the upper power, i.e., the high frequency power applied to the upper electrode, and the amount of CD shift is shown in FIG. 10. In detail, FIG. 10 is a broken line graph showing the amounts of CD shift when the levels of the upper power were 400 W, 800 W and the averages of the amounts of CD shift at the respective upper power levels. According to the experimental results of FIG. 10, when the upper power ranged from 400 W to 1200 W, it can be seen that the amount of CD shift tended to be slightly reduced as the upper power increased. Furthermore, a desired result, in which the amounts of CD shift could be suppressed around 20 nm, could be obtained.

It is sufficient if the upper power (high frequency power for plasma generation) and the frequency thereof are at levels sufficient to ignite plasma. In this regard, it is preferable that the high frequency power (high frequency power for bias voltage generation) not be applied to the lower electrode in the first ashing process (that is, 0 W).

Figure 11:
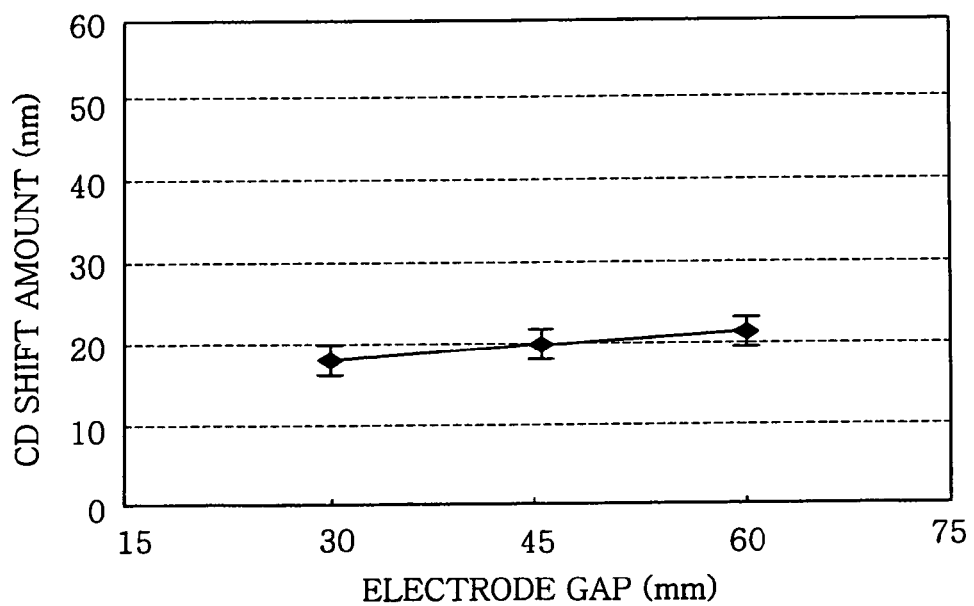
FIG. 11 depicts a view showing the relationship between the gap between electrodes and the amount of CD shift in the first ashing process.

Next, the relationship between the gap between the upper electrode and lower electrode and the amount of CD shift is shown in FIG. 11. FIG. 11 is a broken line graph showing the amounts of CD shift when the levels of the electrode gap were 30 mm, 45 mm and 60 mm in Table 1. That is, FIG. 11 plots the averages of the amounts of CD shift at the respective levels of the electrode gap. According to the experimental results of FIG. 11, it can be appreciated that, in an electrode gap ranging from 30 mm to 60 mm, the amount of CD shift tended to be slightly reduced as the electrode gap decreased. Furthermore, a desired result, in which the amounts of CD shift could be suppressed below 20, could be obtained.

Figure 12:
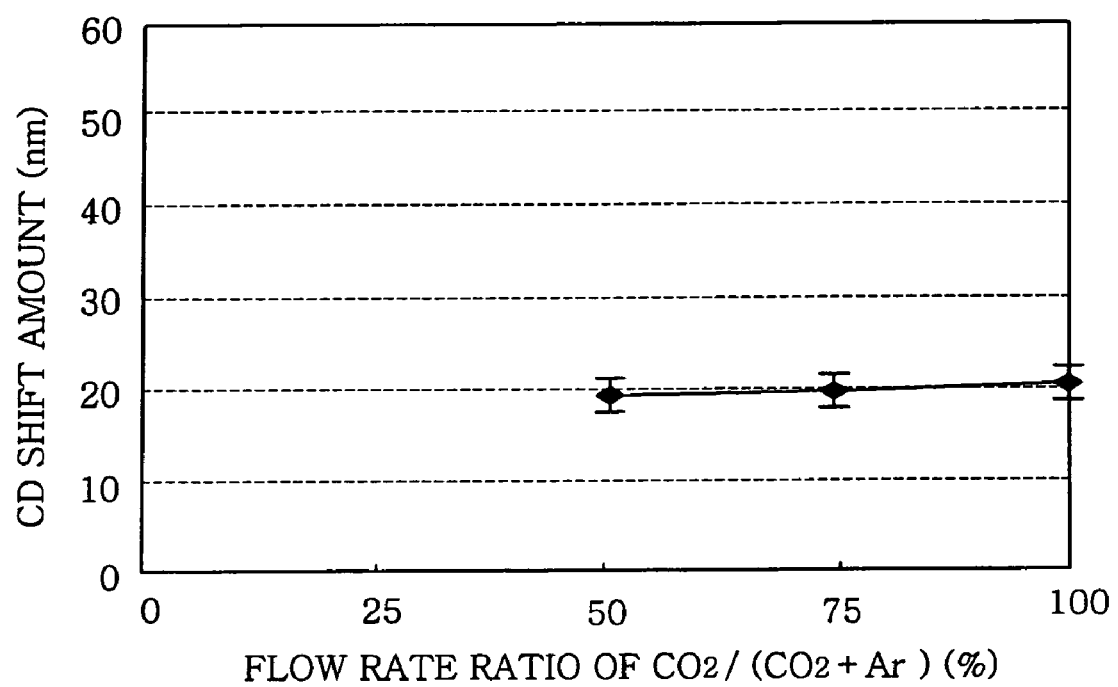
FIG. 12 illustrates a view showing the relationship between the flow rate of processing gas and the amount of CD shift in the first ashing process.

Next, the relationship between the ratio (%) of flow rates $CO_2/(CO_2+Ar)$ and the amount of CD shift is shown in FIG. 12. In detail, FIG. 12 is a broken line graph showing the amounts of CD shift when the levels of the ratio (%) of the flow rates $CO_2/(CO_2+Ar)$ were 50%, 75% and 100%, respectively, in Table 1. That is, FIG. 12 plots the averages of the amounts of CD shift at the respective levels of the ratio (%) of the flow rates $CO_2/(CO_2+Ar)$. According to the experimental results of FIG. 12, a desired result in which, when the ratio (%) of the flow rates $CO_2/(CO_2+Ar)$ ranged from 50% to 100%, the amounts of CD shift were almost the same and could be suppressed below approximately 20 nm could be obtained. Furthermore, according to these experiments, it can be appreciated that, for example, by using the gaseous mixture of $CO_2$ and Ar, the CD shift amount can be suppressed at an efficiency equivalent to that in the case of using the simple $CO_2$ gas in the first ashing process.

(Experiments on Second Ashing Process)

Next, the optimal (or optimal range of) process conditions for maintaining the low-k film 208 in a desired state are described with reference to the results of experiments on the performance of the second ashing process on the wafer 200 of FIG. 3 while various parameters were changed. Further, the experiments for finding the optimal process conditions of the second ashing process were performed, with the wafer 200 having a trench set in the cleaned processing chamber 102 whose inner walls did not have reaction products such as fluorine polymer deposited thereon, unless explicitly described otherwise. The reason for this was to prevent the effect of the first ashing process from being included in the experimental results.

As in the experiment of the first ashing process, the present experiment also determines the extent of the damage to the low-k film caused by the plasma ashing process based on the amount of the low-k film eroded when the sample wafer was dipped in a fluoric acid solution. The determination method will be described in detail with reference to FIGS. 13A and 13B below.

Figure 4:
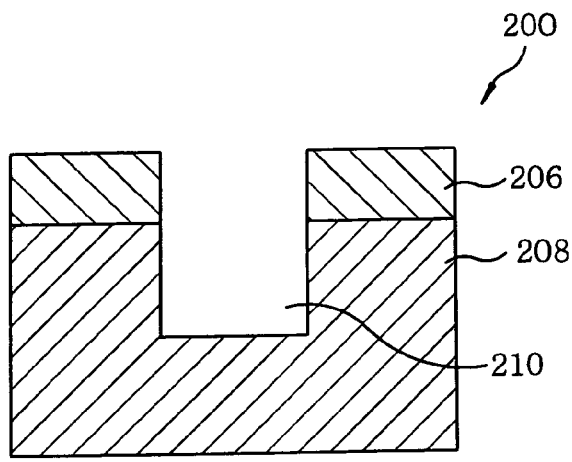
FIG. 4 provides a schematic sectional view showing the film structure obtained after the wafer shown in FIG. 3 is ashed.

When the second ashing process was performed on the wafer 200 shown in FIG. 3, the photoresist 202 was removed through the second ashing process, therefore the film structure of the wafer 200 was formed as shown in FIG. 4. The wafer 200 after the second ashing process is shown in FIG. 13A.

Figure 13A:
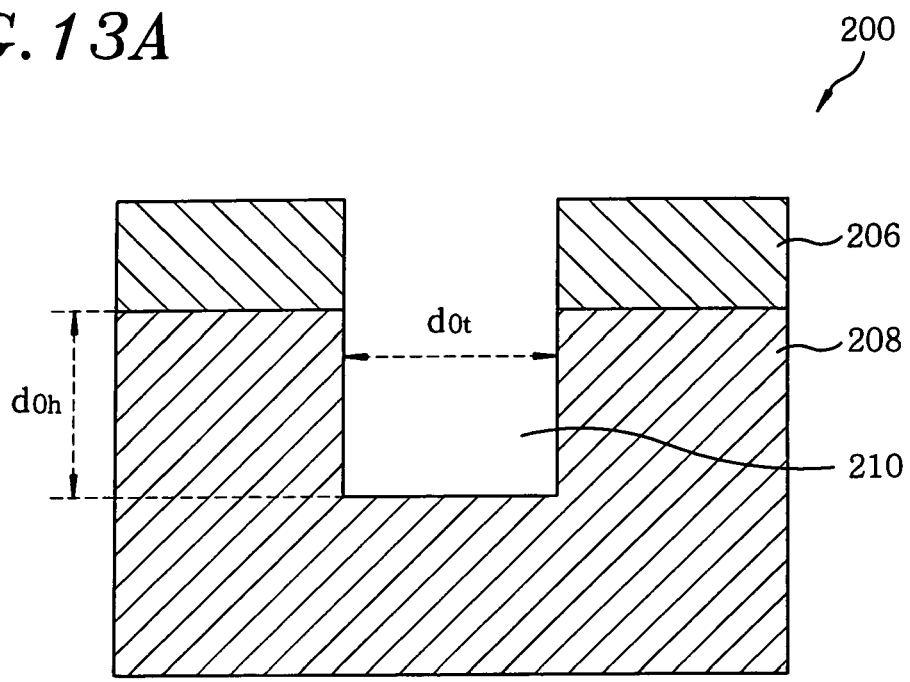
FIGS. 13A and 13B present views illustrating a method of determining the extent of damage to a low-k film occurring due to a second ashing process.
Figure 13B:
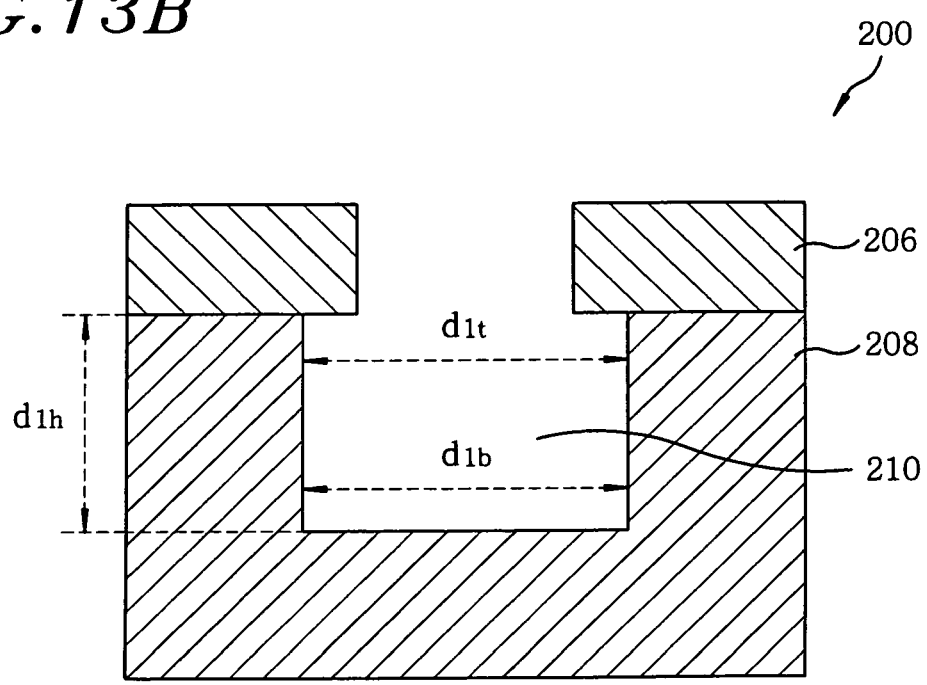

When the wafer 200 of FIG. 13A was dipped in the fluoric acid solution after the second ashing process, if the low-k film 208 was damaged in the second ashing process, the exposed side walls of the low-k film 208 were partially dissolved as shown in FIG. 13B.

The amount of dissolution loss $\Delta d$ corresponds to the range of the low-k film 208 whose constituent composition was changed due to the dissociation of C (carbon atoms) or the like. Therefore, the more the amount of dissolution loss $\Delta d$, the greater the damage to the low-k film 208 caused by the plasma ashing process, as in the first ashing process. Furthermore, the amount of dissolution loss $\Delta d$ was represented as a CD shift, i.e., a change in the gap width (or the diameter of a hole) of the trench, as shown in FIGS. 13A and 13B. In practice, the CD shifts of the trench (or the hole) may vary in a depth direction. Therefore, in the experiments on the second ashing process, the amounts of dissolution loss $\Delta d$ were obtained by measuring an upper gap width $d_{1t}$ (or the upper hole diameter), a bottom portion gap width $d_{1b}$ (or the bottom portion hole diameter) and a gap depth $d_{1h}$ (or the hole depth) of the low-k film 208 after the low-k film 208 was dipped in the fluoric acid solution. In detail, when the gap width (or the hole diameter) and gap depth (or the hole depth) of the low-k film 208 were respectively $d_{ot}$ and $d_{oh}$ before the low-k film 208 was dipped in the fluoric acid solution, the amounts of the upper gap width (or the hole diameter), the bottom portion gap width (or the hole diameter of the bottom portion) and the gap depth (or the hole depth), that is, the amounts of CD shifts $\Delta d_{1t}$, $\Delta d_{1b}$ and $\Delta d_{1h}$ were as follows: $\Delta d_{1t}=d_{1t}-d_{ot}$, $\Delta d_{1b}=d_{1b}-d_{ot}$ and $\Delta d_{1h}=d_{1h}-d_{oh}$. The average $\Delta d_1$ of the amounts of the CD shifts $\Delta d_{1t}$, $\Delta d_{1b}$ and $\Delta d_{1h}$ is, for example, determined to be the extent of the damage to the low-k film.

(Dependency on Pressure in Processing Chamber in Second Ashing Process)

Using the above-described determination method, the results of experiments on the pressure dependency in the processing chamber in the second ashing process will be descried. In these experiments, with respect to the wafer 200 of FIG. 4 on which the plasma etching process had been performed by using the plasma processing apparatus 100 in accordance with the present embodiment, the second ashing process was performed under changed pressures in the processing chamber, and then the extents of the damage to the low-k film (the amounts of CD shift) and ashing rates were measured.

In these experiments, after the second ashing process had been performed with respect to the cases of using a low pressure of 15 mTorr and a high pressure of 200 mTorr in the processing chamber, the amounts of CD shift $\Delta d_{1t}$, $\Delta d_{1b}$ and $\Delta d_{1h}$ and ashing rates AR of the low-k film 208 were measured. The results of the experiments are given in Table 2.

The different process conditions under which the second ashing process was performed at a high pressure of 200 mTorr in the processing chamber are as follows. That is, the gap between the upper electrode 121 and the susceptor (lower electrode) 105 was set to 55 mm, the high frequency power applied to the upper electrode 121 was set to 0 W (that is, the high frequency power was not applied to the upper electrode 121), and the high frequency power (for example, at a frequency of 2 MHz) applied to the susceptor (lower electrode) 105 was set to 300 W. Furthermore, $CO_2$ gas was used as the processing gas and the flow rate thereof was 700 sccm. Furthermore, the pressure of the rear cooling gas (backside gas) for the wafer 200 was 10 Torr at the central portion thereof and 35 Torr at the edge portion thereof. For the set temperature in the processing chamber 102, the temperature of the upper electrode, the temperature of the side wall portion and the temperature of the lower electrode were 60° C., 50° C. and 40° C., respectively. The process time of the second ashing process was 44 sec.

Furthermore, the different process conditions under which the second ashing process was performed at a low pressure of 15 mTorr in the processing chamber are as follows. That is, the gap between the upper electrode 121 and the susceptor (lower electrode) 105 was set to 55 mm, the high frequency power (frequency of 50 MHz) applied to the upper electrode 121 was set to 500 W, and the high frequency power (frequency of 2 MHz) applied to the susceptor (lower electrode) 105 was set to 100 W. Furthermore, the processing gas was $CO_2$ gas and the flow rate thereof was 700 sccm. Furthermore, the pressure of the rear cooling gas (backside gas) for the wafer 200 was 10 Torr at the central portion thereof and 35 Torr at the edge portion thereof. Furthermore, for the set temperature in the processing chamber 102, the temperature of the upper electrode, the temperature of the side wall portion and the temperature of the lower electrode were 60° C., 50° C. and 40° C., respectively. The process time of the second ashing process was 66 sec.

TABLE 2

| | Pressure in processing chamber (mTorr) | | | |
|---|---|---|---|---|
| | 15 | | 200 | |
| | Central portion | Edge portion | Central portion | Edge portion |
| $\Delta d_{1t}$ | 20 | 18 | 9 | 12 |
| $\Delta d_{1b}$ | 15 | 14 | 8 | 12 |
| $\Delta d_{1h}$ | 6 | 7 | 4 | 13 |
| $\Delta d_1$ (average) | 13.6 | 13 | 7 | 12.3 |
| Ashing time (sec) | 66 | | 44 | |
| AR (nm/min) | 303.7 | | 322.1 | |

From the experimental results shown in the Table 2, it can be appreciated that, in the range in which the pressure in the processing chamber was equal to or lower than 200 mTorr, the amount of CD shift was reduced as the pressure in the processing chamber was increased, thereby reducing the damage to the low-k film 208. Furthermore, even when the pressure in the processing chamber was at 200 mTorr or was reduced to 15 mTorr, the amount of CD shift was lower than the conventional amount. Moreover, from the experimental results shown in Table 2, it can be appreciated that an ashing rate AR got higher as the pressure in the processing chamber got higher, so that the ashing could be performed at a higher speed. Accordingly, it is preferable for the pressure in the processing chamber to be high in the second ashing process.

Figure 14:
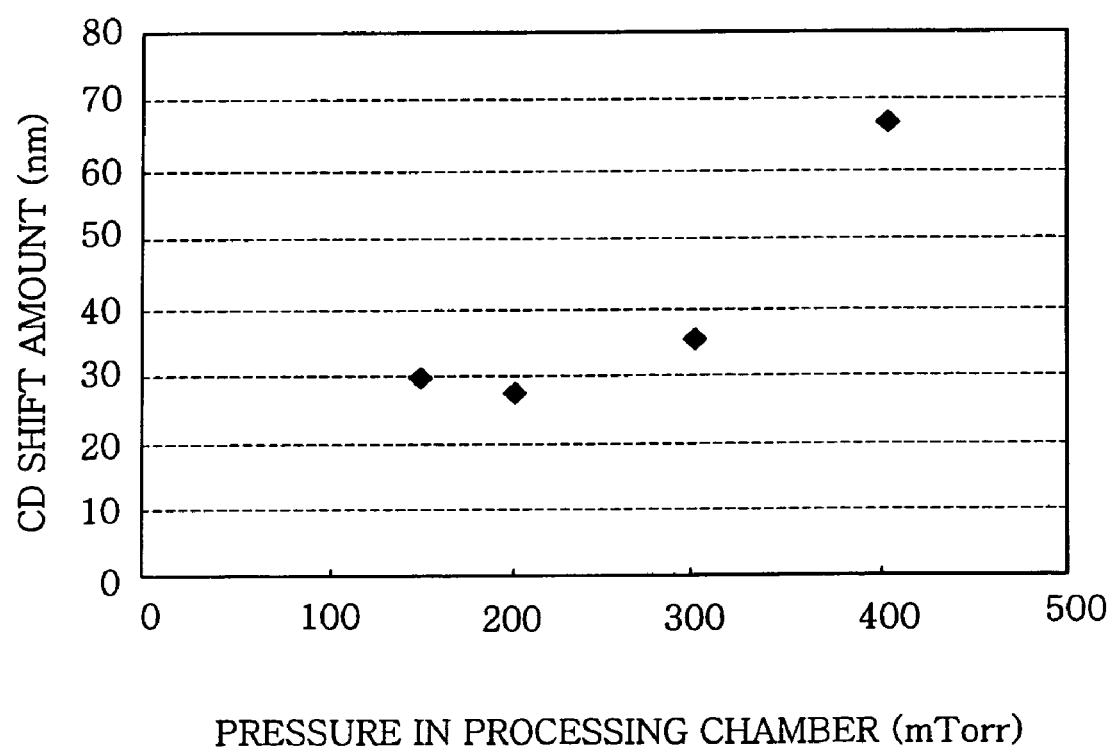
FIG. 14 provides a view showing the relationship between the pressure in a processing chamber and the amount of CD shift in the second ashing process.

With respect to a separate sample including a low-k film having a dielectric constant lower than that of the low-k film of the wafer 200 (a wafer having a film structure in which an etching stop film including SiC film, a porous low-k film having an MSQ film, and an $SiO_2$ film were stacked one on top of another, with a trench being formed in the porous low-k film), the second ashing process was performed under changed pressures in the processing chamber as described above, and the amounts of CD shift were measured. However, in this case, since the amounts of CD shift were obtained by using the sample having the etching stop film, the amounts of CD shift corresponded to the amounts of change in the trench gap width (or the hole diameter) defined in the experiments on the first ashing process. The results of the experiments are shown in FIG. 14. In these experiments, the amounts of CD shift were measured by performing the second ashing process also in the range where the pressure in the processing chamber was higher than 200 mTorr.

From the experimental results shown in FIG. 14, it can be appreciated that, up to a pressure of approximately 200 mTorr in the processing chamber, the amount of CD shift was reduced as the pressure in the processing chamber got higher. Thus, there is a tendency similar to that shown in Table 2. However, it can also be observed that the amount of CD shift gradually increased when the pressure in the processing chamber exceeded 200 mTorr, and then abruptly increased when it exceeded 400 mTorr. Accordingly, although it is preferable for the pressure in the processing chamber to be higher during the second ashing process as described above, if judging from the view point of suppression of the damage to the low-k film 208, a preferable condition for the pressure in the processing chamber is to be less than 400 mTorr.

(Frequency Dependency of Second High Frequency Power in Second Ashing Process)

Next, the results of experiments on the frequency dependency of the second high frequency power applied to the susceptor (lower electrode) 105 in the second ashing process are described. Using the plasma processing apparatus 100 in accordance with the present embodiment, the second ashing process was performed on a sample identical to the wafer 200 again while the frequency of the second high frequency power was changed, and the extents of the damage to the low-k film (amounts of CD shift) and the ashing rates thereof were measured.

In these experiments, the second ashing process was performed with respect to the cases where the frequencies of the second high frequency power were 2 MHz and 13.56 Hz, respectively, and the amounts of CD shift $d_{1t}$, $d_{1b}$ and $d_{1h}$ of the low-k film 208 and the ashing rate thereof were measured. The experimental results are shown in Table 3.

Furthermore, other process conditions under which the second ashing process was performed at the frequency of the second high frequency power, 2 MHz, are as follows. That is, the gap between the upper electrode 121 and the susceptor (lower electrode) 105 was set to 55 mm, the high frequency power applied to the upper electrode 121 was 0 W (that is, high frequency power was not applied to the upper electrode 121), and the high frequency power applied to the susceptor (lower electrode) 105 was 300 W. The processing gas was $CO_2$ gas and the flow rate thereof was 700 sccm. The pressure of the rear cooling gas (backside gas) for the wafer 200 was 10 Torr at the central portion there of and 35 Torr at the edge portion thereof. For the set temperature in the processing chamber 102, the temperature of the upper electrode, the temperature of the side wall portion and the temperature of the lower electrode were 60° C., 50° C. and 40° C., respectively. The process time of the second ashing process was 44 sec. In this case, one period of Voltage $V_{pp}$ from peak to peak of the alternating component of the second high frequency power (2 MHz, 300 W) was 1300 V. Since the $V_{pp}$ changes depending on the state of plasma excitation in the processing chamber, for example, a change in plasma density, it can serve as an index of the plasma state.

Further, as for other process conditions under which the second process was performed at the frequency of the second high frequency power, 13.56 MHz, the high frequency power applied to the susceptor (lower electrode) 105 was 1100 W, and the process time of the second ashing process was 21 sec. Descriptions of other process conditions are omitted here because they are the same as those in the case where the frequency of the second high frequency power was 2 MHz. In this case, one period of Voltage $V_{pp}$ from peak to peak of the alternating component of the second high frequency power (13.56 MHz, 1100 W) was 1200 V, which was almost the same as that in the above-described case where the frequency of the second high frequency power was 2 MHz.

TABLE 3

| | Frequency of second high frequency power (MHz) | | | |
|---|---|---|---|---|
| | 2 | | 13.56 | |
| | Central portion | Edge portion | Central portion | Edge portion |
| $\Delta d_{1t}$ | 9 | 12 | 10 | 12 |
| $\Delta d_{1b}$ | 8 | 12 | 7 | 10 |
| $\Delta d_{1h}$ | 4 | 13 | 0 | 8 |
| $\Delta d_1$ (average) | 7 | 12.3 | 5.7 | 10 |
| Ashing time (sec) | 44 | | 21 | |

From the experimental results shown in Table 3, it can be appreciated that the amount of CD shift was slightly reduced at the higher frequency of the second high frequency power in the range in which the frequency of the second high frequency power was equal to or lower than 13.56 MHz, thereby reducing the damage to the low-k film 208. Further, in the range in which the frequency of the second high frequency power was equal to or lower than 13.56 MHz, the amount of CD shift was lower than the conventional amount even when the frequency of the second high frequency power was at 2 MHz or was reduced to 2 MHz. Furthermore, from the experimental results shown in Table 3, it can be appreciated that the ashing time was reduced at a higher frequency of the second high frequency power, so that the ashing could be performed at a higher speed. Accordingly, it is preferable that the frequency in the processing chamber be higher in the second ashing process.

As described above, it is thought that the reason why the ashing is performed at a higher speed at the higher frequency of the second high frequency power is that, as the frequency increases, the ashing can be performed by using more ions ($CO_2^+$ or the like). That is, since the density of plasma increases as the frequency increases, an electric current is easy to flow, and therefore a voltage therebetween decreases. Accordingly, it is necessary to increase the second high frequency power in order to prevent the voltage from decreasing. In the embodiment described above, the second high frequency power increases from 300 W up to 1100 W. When the second high frequency power is higher, the number of the ions ($CO_2^+$) generated by the plasma increases, and therefore it is possible to perform the ashing by using more ions.

As described above, since the second high frequency power needs to be increased as the frequency of the second high frequency power increases, it is possible to perform ashing at a higher speed as the second high frequency power increases. Furthermore, since the amount of the second high frequency power depends on the performance of the plasma processing apparatus and the like, it is more preferable to use 13 MHz to 40 MHz as the currently practical frequency of the second high frequency power.

Furthermore, although the case where $CO_2$ is used as the processing gas in the second ashing process has been described in the present embodiment, the processing gas is not limited to $CO_2$. That is, the processing gas may be $O_2$ or a gaseous mixture of $CO_2$ and $O_2$.

(Preferred Process Conditions in Plasma Ashing Process)

Based on the experimental results described above, the optimal process conditions of the plasma ashing process performed by using the plasma processing apparatus 100 in accordance with the first embodiment are shown in Table 4.

TABLE 4

|  | First ashing process | Second ashing process |
| --- | --- | --- |
| Pressure in processing chamber (mTorr) | 30 or lower | Lower than 400 |
| Processing gas | $CO_2$ or gaseous mixture of $CO_2$ and Ar | $O_2$ or $CO_2$ or gaseous mixture of $O_2$ and $CO_2$ |
| First high frequency power (upper power) | Arbitrary frequency | 0 W (or low power at 27 MHz or higher) |
| Second high frequency power (lower power) | 0 W | Arbitrary frequency (preferably, 13 to 40 MHz) |

As shown in Table 4, it is preferable to maintain pressure in the processing chamber at a pressure equal to or lower than 30 mTorr in the first ashing process. Although it is preferable to use $CO_2$ as the reaction products removal processing gas, a gaseous mixture of $CO_2$ and Ar may be used. For the first high frequency power in the first ashing process, an arbitrary power may be used as long as it can ignite plasma. In this case, the frequency may be arbitrarily set. It is preferable that the second high frequency power be 0 W (that is, power is not applied to the lower electrode).

Furthermore, in the second ashing process, it is preferable that the pressure in the processing chamber be lower than 400 mTorr. The ashing gas may be either $O_2$ or $CO_2$ or a gaseous mixture of $O_2$ and $CO_2$. For the first high frequency power in the second ashing process, it is most preferable that the power be 0 W (that is, power is not applied to the upper electrode). When the first high frequency power is used, it is preferable that the power be as low as possible and the frequency thereof be equal to or higher than 27 MHz. In this case, it is preferable that the frequency of the second high frequency power be 13 to 40 MHz and the second high frequency power be determined depending on the frequency.

By performing the plasma ashing process under the process conditions, the damage to the low-k film formed on the wafer or the underlying film thereof can be further suppressed compared to the conventional one. Particularly, the effect of suppressing the damage to the low-k film in the first ashing process is high. Furthermore, the ashing can be performed at a higher speed in the second ashing process.

(Example of Configuration of Plasma Processing Apparatus in Accordance with Second Embodiment)

Figure 15:
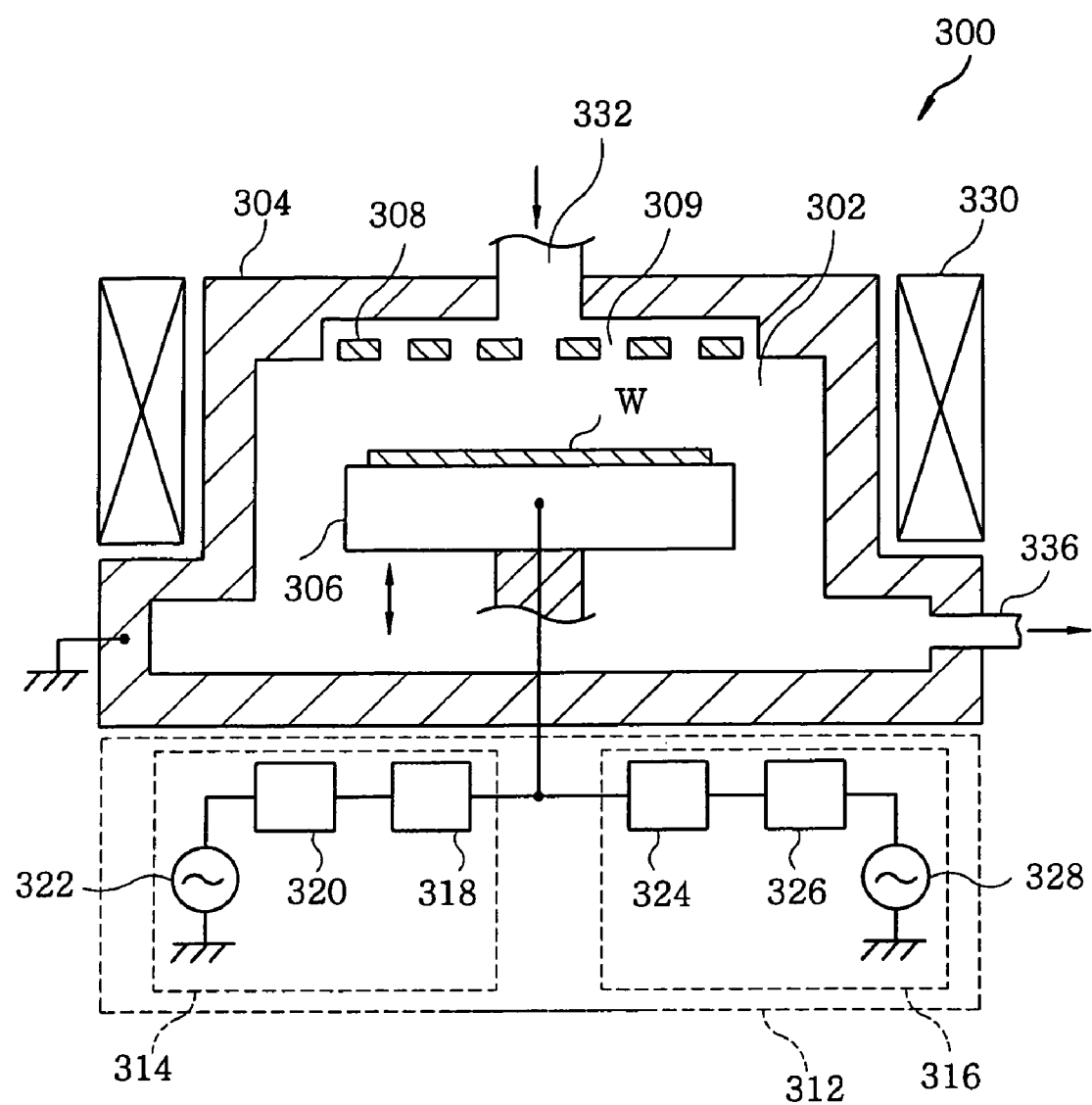
FIG. 15 shows a sectional view showing an example of the configuration of a plasma processing apparatus in accordance with a second embodiment of the present invention.

Next, an example of the configuration of the plasma processing apparatus in accordance with a second embodiment of the present invention is described with reference to the drawing. FIG. 15 shows the schematic configuration of a plasma processing apparatus 300 in accordance with a second embodiment. The plasma processing apparatus 300 shown in FIG. 15 applies the first high frequency power (plasma generation high frequency power) having a comparatively high frequency of, for example, 400 MHz and the second high frequency power (high frequency power for bias voltage generation) having a comparatively low frequency of, for example, 3.2 MHz to an electrode (lower electrode) which is also used as a loader, in an overlapping fashion. The plasma ashing method in accordance with the present invention can be also applied to such a type of plasma processing apparatus 300.

The plasma processing apparatus 300 has a processing chamber 302 including, for example, a grounded, sealed processing container 304, as shown in FIG. 15. A conductive lower electrode 306, which is also used as a mounting plate to mount a wafer W thereon, is disposed in the processing chamber 302 so that it can move vertically. The lower electrode 306 is maintained at a desired temperature by using a temperature control device (not shown), and a heat-conductive gas is supplied to the gap between the wafer W and the lower electrode 306 at a desired pressure by a heat-conductive gas provision device (not shown). An upper electrode 308 is disposed at a location facing the mounting surface of the lower electrode 306.

A gas inlet opening 332 connected to a gas supply source (not shown) is formed above the processing chamber 302 so as to introduce a desired processing gas into the processing chamber 302. The processing gas introduced into the processing chamber 302 is introduced onto the wafer W via a plurality of gas discharge openings 309 formed in the upper electrode 308. For example, $CF_4$ gas, $CHF_3$ gas, $C_4F_8$ gas, $O_2$ gas, He gas, Ar gas, $N_2$ gas and a mixture thereof are introduced into the processing chamber 302 as the processing gas.

A gas exhaust line 336 connected to an exhaust valve and a gas exhaust system (not shown) is disposed under the processing chamber 302. The gas in the processing chamber 302 is vacuum-exhausted through the gas exhaust line 336 and the processing chamber 302 is maintained at a desired vacuum level of, for example, 50 mTorr. Furthermore, magnets 330 are arranged on sides of the processing chamber 302, by which a magnetic field (multipole magnetic field) for confining the plasma near the inner walls of the processing chamber 302 is formed. The strength of the magnetic field is variable.

A power supply device 312 for supplying power in which two frequencies are superimposed on each other is connected to the lower electrode 306. The power supply device 312 includes a first power supply unit 314 for supplying the first high frequency power having a first frequency, and the second high frequency power supply unit 316 for supplying the second high frequency power having a second frequency.

The first power supply unit 314 has a first filter 318, a first matching unit 320, and a first power supply 322 that are sequentially connected to the lower electrode 306. The first filter 318 prevents a power component having the second frequency from entering the first matching unit 320. The first matching unit 320 matches the first high frequency power component. The first frequency is, for example, 100 MHz.

The second power supply system 316 has a second filter 324, a second matching unit 326 and a second power supply 328 that are sequentially connected to the lower electrode 306. The second filter 324 prevents a power component having the first frequency from entering the second matching unit 326. The second matching unit 326 matches the second high frequency power component. The second frequency is, for example, 3.2 MHz.

In the plasma processing apparatus 300 constructed as described above, processing gas introduced into the processing chamber 302 is converted into a plasma by two types of high frequency power outputs by the power supply 312 and a horizontal magnetic field formed by the magnets 330, and etching and ashing processes are performed on the wafer W by using the energy of ions and radicals accelerated by generated magnetic bias voltage.

(Detailed Example of Process Performed on Wafer)

The plasma processing apparatus 300 of the present invention constructed as described above performs an etching process on, for example, the wafer 200 shown in FIG. 3, like the plasma processing apparatus 100 of the first embodiment shown in FIG. 1, and then an ashing process is performed in the same processing chamber.

A detailed example of the plasma ashing process is described below. The plasma ashing process is performed by sequentially performing a first to a third etching process. First, in the first etching process, an anti-reflection film 204 is etched by using a patterned photoresist film 202 as a mask. As for the process conditions under which the first etching process is performed, the pressure in the processing chamber 302 is adjusted to, for example, 10 mTorr, the first high frequency power (for example, at 100 MHz) applied to the lower electrode 306 from the first power supply 322 is 1500 W, and the second high frequency power (for example, at 3.2 MHz) applied to the lower electrode 306 from the second power supply 328 is 0 W (that is, the second high frequency power is not applied). Furthermore, $CF_4$ gas is used as the processing gas.

Next, in the second etching process, the protection film 206 and the low-k film 208 are etched by using the patterned photoresist film 202 as a mask. As for the process conditions under which the second etching process is performed, for example, the pressure in the processing chamber 302 is adjusted to 50 mTorr, the first high frequency power applied to the lower electrode 306 from the first power supply 322 is 2000 W, and the second high frequency power (for example, at 3.2 MHz) applied to the lower electrode 306 from the second power supply 328 is 200 W. Furthermore, a gaseous mixture of $CF_4$ and Ar is used as the processing gas.

By performing the first and second etching processes described above, the trench 210 is formed in the low-k film 208, as shown in FIG. 3. After the plasma etching process, a plasma ashing process for removing the photoresist film 202 is performed on the wafer 200 in the same processing chamber 302.

However, in accordance with the plasma process method of applying two types of high frequency power to the lower electrode in an overlapping fashion by using such a plasma processing apparatus 300, a plasma density and a bias voltage can be controlled independently. Furthermore, since the high frequency power is applied only to the lower electrode, high frequency power need not be applied to the upper electrode, therefore there is an advantage in that the apparatus is not complicated.

However, in accordance with the plasma process method of applying two types of high frequency power to the lower electrode in an overlapping fashion, when the low-k film is etched by using the resist film as a mask and by using processing gas containing fluorine and then the resist film is ashed by using the processing gas that contains $O_2$ gas as a main gas in the same processing chamber, bias voltage is generated by the first high frequency power even when the second high frequency power is 0 W. In the ashing process, since the fluorine used in the plasma etching process described above remains in the processing chamber, there is the concern that the fluorine is accelerated in the directions of the low-k film and the underlying film thereof by the bias voltage and erodes the low-k film or the underlying film thereof.

According to the plasma ashing process in accordance with the present invention, since it is possible to remove fluorine remaining in the processing chamber by using the processing gas that contains $CO_2$ gas as a main gas in the first process, and then remove the resist film in the second ashing process, the damage to the low-k film or the underlying film thereof can be suppressed.

(First High Frequency Power and Second High Frequency Power)

Furthermore, in the case of performing the plasma ashing process by using the plasma processing apparatus 300 in which power having two different types of frequencies are applied, it is preferable to set the first and the second high frequency power as follows.

First, it is preferable that the frequency of the first high frequency power in the first ashing process can ignite the plasma even when the pressure in the processing chamber is equal to or lower than 30 mTorr. In detail, it is preferable to maintain the frequency above 13 MHz. Furthermore, as for the first high frequency power, it is preferable to set the power depending on the frequency.

Furthermore, as for the frequency of the first high frequency power in the second ashing process, it is preferable to set the frequency within a range between 13 MHz and 40 MHz. In this case, although it is preferable to set the second high frequency power to 0 W, the second high frequency power may be used. In this case, the damage to the low-k film 208 when the frequency of the first high frequency power is 13.56 MHz and the second high frequency power is 0 W is the same as the experimental result of Table 3 for the case where the frequency of the second high frequency power applied to the lower electrode in the plasma processing apparatus 100 is set to 13.56 MHz. Accordingly, since the damage to the low-k film 208 can be further suppressed compared to the conventional one, the ashing time is reduced, and therefore the ashing can be performed at a higher speed.

Furthermore, since the first high frequency power in the plasma processing apparatus 300 is applied to the lower electrode, the frequency of the first high frequency power in the second ashing process may be equal to or higher than 40 MHz. This is based on the following reason. That is, since, in the plasma processing apparatus 300 shown in FIG. 15, the first high frequency power is applied to the lower electrode, plasma is generated immediately above the wafer, and therefore the number of ions increases compared to that in the plasma processing apparatus 100 of FIG. 1 in which the power is applied to the upper electrode.

In this case, since the ashing is mainly performed by the ions and the ions lose the energy thereof on the surface of the wafer, it is difficult to exert the influence of the ashing onto the inside of the film formed on the wafer. Accordingly, although the first high frequency power is increased by increasing the frequency of the first high frequency power applied to the lower electrode, it is difficult to exert the influence of the ashing onto the low-k film 208.

If the first high frequency power is increased by increasing the frequency of the first high frequency power, which is applied to the upper electrode 121 of the plasma processing apparatus 100 of FIG. 1, to a frequency equal to or higher than 40 MHz, the damage to the low-k film 208 becomes high. This is based on the following reason. That is, since the plasma is generated by applying the first high frequency power to the upper electrode 121, the plasma near the upper electrode 121 is thick, while the plasma near the wafer spaced apart from the upper electrode 121 is thin. Moreover, since the lifespan of radicals is long, many radicals exist near the upper electrode 121.

In the case of ashing performed by using radicals, the ashing is performed onto the film as well as on the surface of the wafer, unlike the case of using ions described above. As described above, when the first high frequency power applied to the upper electrode is increased, the number of radicals becomes large, and therefore the damage to the low-k film 208 becomes high. Furthermore, in the case that the first high frequency power applied to the lower electrode is increased, the number of the radical becomes large. Since, however, an ashing rate becomes high and the ashing time is accordingly reduced, the low-k film 208 may be hardly to get damaged.

Furthermore, in the case of increasing the frequency of the first high frequency power to a frequency equal to or higher than 40 MHz in the second ashing process, the density of plasma is suddenly increased, and therefore it is preferable to set the frequency of the second high frequency power to a frequency equal to or lower than 13 MHz in order to increase ion energy. However, the frequency of the second high frequency power may be 0 W depending on the frequency of the first high frequency power.

The results of experiments on the second ashing process that were performed when the frequencies of the first and second high frequency power were 100 MHz and 3.2 MHz, respectively, will be described below. The second ashing process was performed on the wafer 200 of FIG. 4 by using the plasma processing apparatus 300 in accordance with the present embodiment, and the extents of the damage to the low-k film (the amounts of CD shift) and ashing rates were measured. The results of the experiments are shown in Table 5.

Furthermore, other process conditions under which the second ashing process in these experiments was performed are as follows. That is, the pressure in the processing chamber was 50 mTorr, the first high frequency power applied to the lower electrode was 400 W, and the second high frequency power applied to the lower electrode was 300 W. Furthermore, $CO_2$ gas was used as the processing gas, the flow rate thereof was 700 sccm, and the strength of a magnetic field was 300 G. Furthermore, the pressure of rear cooling gas (backside gas) for the wafer 200 was 10 Torr at the central portion thereof and 50 Torr at the edge portion thereof. Furthermore, the set temperature in the processing chamber 102 was 50° C. at the upper electrode, 60° C. at the side wall portion and 40° C. at the lower electrode. The process time of the second ashing process was 44 sec.

TABLE 5

| | First high frequency power (100 MHz) Second high frequency power (3.2 MHz) | |
|---|---|---|
| | Central portion | Edge portion |
| $\Delta d_{1f}$ | 17 | 12 |
| $\Delta d_{1b}$ | 5 | 2 |
| $\Delta d_{1h}$ | 0 | 0 |
| $d_1$ (average) | 7.3 | 4.7 |
| AR (nm/min) | 370.6 | |

From the experimental results shown in Table 5, it can be appreciated that, even if the first high frequency power was increased to 100 MHz, the amount of CD shift was sufficiently small and the damage to the low-k film 208 was also small. Furthermore, from the experimental results shown in FIG. 5, it can be appreciated that the ashing rate AR became high, and therefore the ashing process could be performed at a higher speed. Accordingly, it is preferable that the frequency of the first high frequency power be equal to or higher than 40 MHz in the second ashing process.

Furthermore, since the process conditions other than the first and the second high frequency power under which the plasma ashing process was performed in the plasma processing apparatus 300 were the same as those for the plasma processing apparatus 100 shown in FIG. 1, descriptions thereof are omitted here.

Although the preferred embodiments of the present invention have been described with reference to the accompanying drawings, the present invention is not limited to the embodiments. It is apparent that those skilled in the art can make various modifications and variations without departing from the scope of the accompanying claims. Furthermore, it should be understood that the modifications and variations pertain to the technical scope of the present invention.

The present invention can be applied to a plasma ashing method of removing a resist film on an object to be processed to be processed.

While the invention has been shown and described with respect to the preferred embodiments, it will be understood by those skilled in the art that various changes and modifications may be made without departing from the scope of the invention as defined in the following claims.

What is claimed is:

1. A plasma ashing method of removing a patterned resist film in a processing chamber after etching a portion of a low-k film from an object to be processed in the processing chamber by using the patterned resist film as a mask, the method comprising:

a first step comprising supplying a reaction product removal gas including at least $CO_2$ gas into the processing chamber, generating plasma of the reaction product removal gas by applying a high frequency power for the plasma generation, and removing reaction products deposited on an inner wall of the processing chamber substantially without removing the resist film; and a second step comprising supplying an ashing gas into the processing chamber, generating plasma of the ashing gas by applying a high frequency power for the plasma generation, and removing the resist film, wherein a temperature of the object in the second step is higher than that in the first step.

2. The method of claim 1, wherein the reaction product removal gas is $CO_2$ gas.

3. The method of claim 1, wherein the reaction product removal gas includes $CO_2$ gas and inert gas.

4. The method of claim 1, wherein a pressure in the processing chamber in the first step is equal to or lower than 30 mTorr; and wherein a pressure in the processing chamber in the second step is not smaller than 150 mTorr and not greater than 400 mTorr.

5. The method of claim 1, wherein the ashing gas includes any or both of $O_2$ gas and $CO_2$ gas.

6. The method of claim 1, wherein the first step is performed without any high frequency power for bias voltage generation being applied, and the second step is performed with a high frequency power for bias voltage generation being applied.

7. The method of claim 1, wherein the low-k film is a porous low-k film.

8. The method of claim 1, wherein the object is disposed on a second electrode facing a first electrode in the processing chamber and each of the first and the second step further includes adjusting a gap between the first electrode and the second electrode.

9. The method of claim 8, wherein the gap adjusted in the first step ranges from 30 mm to 60 mm.

10. The method of claim 8, wherein the gap in the first step is smaller than the gap in the second step.

11. A plasma ashing method of removing a patterned resist film in a processing chamber after etching a portion of a low-k film of an object to be processed on a second electrode facing a first electrode in the processing chamber by using the patterned resist film as a mask, the method comprising:

a first step comprising supplying a reaction product removal gas including at least $CO_2$ gas into the processing chamber, generating plasma of the reaction product removal gas by applying a high frequency power to the first electrode, and removing reaction products deposited on an inner wall of the processing chamber without any high frequency power being applied to the second electrode substantially without removing the resist film; and a second step comprising supplying an ashing gas into the processing chamber, generating plasma of the ashing gas by applying a high frequency power to the first electrode, and removing the resist film with a high frequency power being applied to the second electrode, wherein a temperature of the object in the second step is higher than that in the first step.

12. The method of claim 11, wherein, in the second step, a frequency of the high frequency power applied to the first electrode is identical to that of the high frequency power applied to the second electrode, and ranges from 13 MHz to 40 MHz.

13. The method of claim 11, wherein, in the second step, a frequency of the high frequency power applied to the first electrode ranges from 27 MHz to 150 MHz, and a frequency of the high frequency power applied to the second electrode ranges from 13 MHz to 40 MHz.

14. The method of claim 11, wherein, in the second step, a pressure in the processing chamber is equal to or lower than 400 mTorr and is not smaller than 150 mTorr.

* * * * *